United States Patent
Sardaryan et al.

(10) Patent No.: US 12,028,232 B2
(45) Date of Patent: Jul. 2, 2024

(54) SYSTEMS AND METHODS FOR TIMING A SIGNAL

(71) Applicant: LDA Technologies Ltd., Mississauga (CA)

(72) Inventors: Sergey Sardaryan, Mississauga (CA); Mariya Sukiasyan, Mississauga (CA); Vahan Sardaryan, Hinsdale, IL (US)

(73) Assignee: LDA TECHNOLOGIES LTD., Mississauga (CA)

(*) Notice: Subject to any disclaimer, the term of this patent is extended or adjusted under 35 U.S.C. 154(b) by 216 days.

(21) Appl. No.: 17/783,962

(22) PCT Filed: Dec. 9, 2020

(86) PCT No.: PCT/CA2020/051693
§ 371 (c)(1),
(2) Date: Jun. 9, 2022

(87) PCT Pub. No.: WO2021/113968
PCT Pub. Date: Jun. 17, 2021

(65) Prior Publication Data
US 2023/0006903 A1 Jan. 5, 2023

Related U.S. Application Data

(63) Continuation-in-part of application No. 17/021,337, filed on Sep. 15, 2020, now Pat. No. 11,178,036, and (Continued)

(51) Int. Cl.
*H04L 43/08* (2022.01)
*H04L 7/00* (2006.01)
(Continued)

(52) U.S. Cl.
CPC ........ *H04L 43/0852* (2013.01); *H04L 7/0033* (2013.01); *H04L 43/022* (2013.01); *H04L 43/106* (2013.01)

(58) Field of Classification Search
CPC . H04L 43/0852; H04L 7/0033; H04L 43/022; H04L 43/106
See application file for complete search history.

(56) References Cited

U.S. PATENT DOCUMENTS 10,177,897 B2   1/2019   Schell et al.
2018/0102895 A1   4/2018   Schell

OTHER PUBLICATIONS

International Search Report and Written Opinion mailed Mar. 10, 2021 in respect of PCT/CA2020/051693.
(Continued)

*Primary Examiner* — Curtis B Odom
(74) *Attorney, Agent, or Firm* — Bereskin & Parr LLP/S.E.N.C.R.L., s.r.l.

(57) ABSTRACT

Systems and methods are provided for timing signals, measuring latency, and/or timestamping. Some of the systems described herein can measure latency in a network device, and can include a signal generator, a sampler, a pulse detector, a timer, and a connector. The signal generator can define a signal profile. The sampler can sample the signal profile at a frequency of at least 4 GHz to generate a plurality of bits, each bit corresponding to a value of the signal profile during the sampling. The pulse detector can detect a change in the signal profile by detecting at least one change in the plurality of bits. The timer can time the change in value in the plurality of bits to provide at least one detection time measurement. The connector can electronically link the signal generator and the sampler to the network device to provide an external network path for transmitting a signal from the signal generator to the sampler via the network device.

22 Claims, 11 Drawing Sheets

Related U.S. Application Data a continuation-in-part of application No. 16/871,439, filed on May 11, 2020, now Pat. No. 10,797,984, and a continuation-in-part of application No. 16/710,258, filed on Dec. 11, 2019, now Pat. No. 10,680,792.

(60) Provisional application No. 62/945,991, filed on Dec. 10, 2019.

(51) Int. Cl.
*H04L 43/022* (2022.01)
*H04L 43/0852* (2022.01)
*H04L 43/106* (2022.01)

(56) References Cited

OTHER PUBLICATIONS

Lockwood et al., "A Low-Latency Library in FPGA Hardware for High-Frequency Trading (HFT)", IEEE 20th Annual Symposium on High-Performance Interconnects, 2012.
Leber et al., "High Frequency Trading Acceleration using FPGAs", 21st International Conference on Field Programmable Logic and Applications, 2011.
Aloisio et al., "High-Speed, Fixed-Latency Serial Links With FPGAs for Synchronous Transfers", IEEE Transactions on Nuclear Science, vol. 56, No. 5, Oct. 2009.

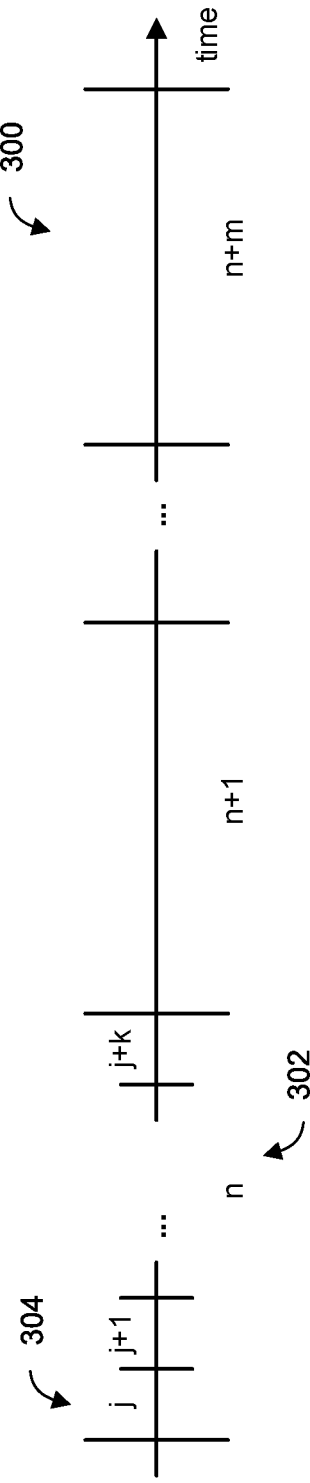
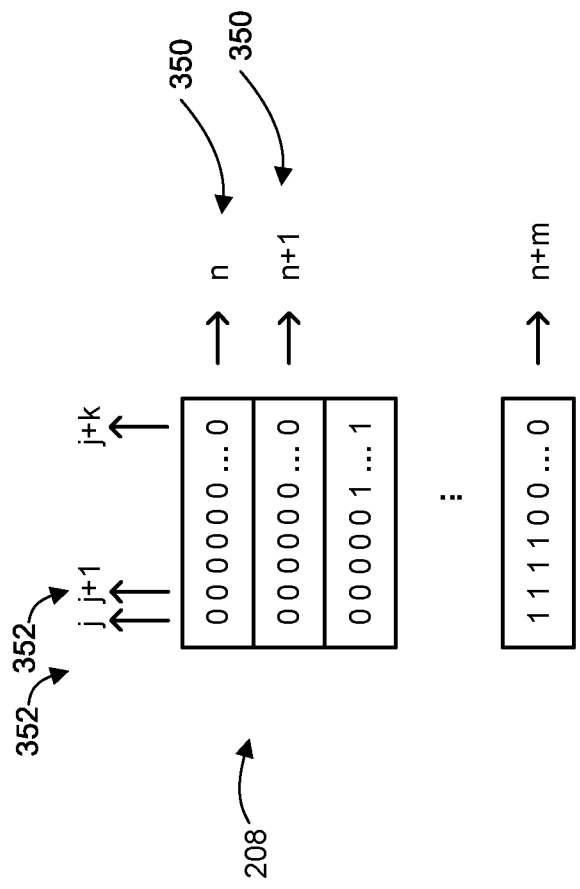

SYSTEMS AND METHODS FOR TIMING A SIGNAL

RELATED APPLICATIONS

This is a national stage application of International Application No. PCT/CA2020/051693 filed Dec. 9, 2020, which claims priority from U.S. Patent Application No. 62/945,991, filed Dec. 10, 2019 entitled "SYSTEMS AND METHODS FOR TIMING A SIGNAL", U.S. patent application Ser. No. 16/710,258, filed Dec. 11, 2019 entitled "SYSTEMS AND METHODS FOR TIMING A SIGNAL", U.S. patent application Ser. No. 16/871,439, filed May 11, 2020 entitled "SYSTEMS AND METHODS FOR TIMESTAMPING A DATA EVENT", and U.S. patent application Ser. No. 17/021,337, filed Sep. 15, 2020 entitled "SYSTEMS AND METHODS FOR MEASURING LATENCY IN A NETWORK DEVICE", the disclosures of which are incorporated, in their entirety, by reference.

FIELD

The embodiments described herein generally relate to timing signals, and in particular to systems and methods for measuring latency and timestamping.

BACKGROUND

The following is not an admission that anything discussed below is part of the prior art or part of the common general knowledge of a person skilled in the art.

Timing a signal can be useful in a wide variety of applications, including, but not limited to, high-frequency trading. High-frequency trading can involve performing a large number of trades (e.g., exchanging financial securities and/or derivatives) within a small period of time, for example, executing millions of orders within fractions of a second. In order to be effective (e.g., profitable), high-frequency trading may require executing trades at very high speeds. Network devices that have relatively high temporal precision and relatively low latency can determine and execute trades relatively quickly and accurately.

FPGA (field programmable gate arrays) are sometimes used in high-frequency trading due to their configurability and processing power. However, the operation of a FPGA may be limited by its clock speed.

SUMMARY

This summary is intended to introduce the reader to the more detailed description that follows and not to limit or define any claimed or as yet unclaimed invention. One or more inventions may reside in any combination or subcombination of the elements or process steps disclosed in any part of this document including its claims and figures.

The various embodiments described herein generally relate to systems and methods for timing signals. The embodiments described herein can involve measuring latency and timestamping.

In accordance with an aspect of this disclosure, there is provided a signal timing method. The method involves: providing a FPGA circuit comprising a serializer for converting data streams between serial transmission and parallel transmission and a signal generator for defining signal profiles, the serializer comprising a serial input sampler for sampling signals received at the serializer, and a clock multiplier for changing signal frequencies, wherein a clock speed of at least one portion of the FPGA circuit is lower than a clock speed of the clock multiplier; reconfiguring the clock multiplier to provide the clock speed of the clock multiplier to the serial input sampler; reconfiguring the serial input sampler to operate at the clock speed of the clock multiplier; during a first mode of operation, operating the signal generator to define a signal profile; instructing the signal generator to change from operating in the first mode of operation to operating in a second mode of operation, wherein the signal profile defined by the signal generator in the first mode of operation differs from the signal profile defined by the signal generator in the second mode of operation, and wherein the signal profile defined by the signal generator during at least one of the first mode of operation and the second mode of operation is defined by the signal generator transmitting a signal to the serializer; operating the serial input sampler to operate at the clock speed of the clock multiplier to sample the signal profile; detecting a change in the signal profile corresponding to the signal generator changing from operating in the first mode of operation to operating in the second mode of operation; and timing the change in value to provide at least one detection time measurement.

In some embodiments, the signal profile can include a non-pulse portion during the first mode of operation, and a pulse portion during the second mode of operation; the pulse portion can differ in value from the non-pulse portion of the signal profile; and, detecting the change in the signal profile corresponding to the signal generator changing from operating in the first mode of operation to operating in the second mode of operation can involve detecting the change in value of the pulse portion relative to the non-pulse portion.

In some embodiments, the clock speed of the clock multiplier can be greater than 4 gigahertz.

In some embodiments, the clock speed of the clock multiplier can be greater than 15 gigahertz.

In some embodiments, operating the serial input sampler to sample the signal profile can involve sampling the signal profile at the clock speed of the clock multiplier to generate a plurality of bits, each bit of the plurality of bits corresponding to a value of the signal profile during the sampling; and detecting the change in the signal profile corresponding to the signal generator changing from operating in the first mode of operation to operating in the second mode of operation can involve detecting at least one change in value in the plurality of bits.

In some embodiments, timing the change in value to provide the at least one detection time measurement can involve counting a number of bits sampled until the change in the signal profile corresponding to the signal generator changing from operating in the first mode of operation to operating in the second mode of operation is detected.

In some embodiments, the method can further involve: connecting the FPGA circuit to a network device; providing an internal network path from the signal generator to the serializer without traversing the network device; providing an external network path from the signal generator to the serializer via the network device, wherein operating the signal generator to define the signal profile can involve transmitting the signal through the internal network path and the external network path to the serializer, operating the serial input sampler to sample the signal profile can involve sampling the signal profile corresponding to the signal i) received via the internal network path and then ii) received via the external network path, and detecting the change in the signal profile corresponding to the signal generator changing from operating in the first mode of operation to operating in the second mode of operation can involve detecting the change in the signal profile corresponding to the signal i) received via the internal network path at a first detection time, and then ii) received via the external network path at a second detection time; and, determining the latency in the network device based at least partly on a detection time difference between the first detection time and the second detection time; wherein the at least one detection time measurement can include the first detection time, the second detection time, and the detection time difference.

In some embodiments, determining the detection time difference can involve counting a number of bits sampled between the first detection time and the second detection time.

In some embodiments, the external network path can include a plurality of links, including the network device and at least one other link, not included in the internal network path; the method can further involve determining a latency of the at least one other link; and the latency in the network device is determined based on the latency of the at least one other link and the detection time difference.

In some embodiments, the internal network path and the external network path can merge at a merging link; the signal transmitted through the internal network path can merge at the merging link with that signal transmitted through the external network path to create a merged signal, the merged signal can define a merged signal profile comprising two changes in the signal profile, each change in the signal profile can correspond to the signal generator changing from operating in the first mode of operation to operating in the second mode of operation; the merged signal can be transmitted to the serial input sampler; operating the serial input sampler to sample the signal profile can involve operating the serial input sampler to sample the merged signal profile; and detecting the change in the signal profile can involve detecting the change in the signal profile at the first detection time and then at the second detection time.

In some embodiments, the merging link can be an OR gate for merging the signal of the internal network path and the signal of the external network path to provide the merged signal.

In some embodiments, the internal network path and the external network path can share a conversion link for transmitting the signal between the merging link and the serializer; the signal generated by the signal generator can have a first signal format; the merged signal at the merging link can have the first signal format; the conversion link can include a plurality of circuit components, including at least one capacitor and at least one resistor, for converting the signal from the first signal format to a second signal format such that the serializer receives the signal in the second signal format.

In some embodiments, the plurality of circuit components can further include at least one biasing component; and converting the signal from the first signal format to the second signal format can involve modifying a voltage level of the signal.

In some embodiments, the first signal format can include a low voltage differential signaling format; and the second signal format can include a current mode logic format.

In some embodiments, the method can further involve: determining that the signal generated by the signal generator has a first signal format different than a second signal format required by the network device; converting the signal from the first signal format to the second signal format so that the signal has the second signal format when the signal traverses the network device; and converting the signal received from the network device from the second signal format back to the first signal format so that the signal has the first signal format when the signal traverses a portion of the external network path between the network device and the serializer.

In some embodiments, the first signal standard can include a first signal frequency, wherein the first signal frequency corresponds to the clock speed of the at least one portion of the FPGA circuit; and the second signal standard can include a second signal frequency within a frequency range required by the network device, wherein the second signal frequency is greater than the first signal frequency.

In some embodiments, the second signal standard can be Ethernet.

In some embodiments, defining the signal profile can involve defining a plurality of signal profiles by operating the signal generator to transmit a plurality of signals through the internal network path and the external network path to the serializer, each signal in the plurality of signals having a corresponding signal profile in the plurality of signal profiles, each signal profile in the plurality of signal profiles including a change in the signal profile corresponding to the signal generator changing from operating in the first mode of operation to operating in the second mode of operation; operating the serial input sampler to sample the signal profile can involve operating the serial input sampler to sample each signal in the plurality of signals i) received via the internal network path, and then ii) received via the external network path; detecting the change in the signal profile corresponding to the signal generator changing from operating in the first mode of operation to operating in the second mode of operation can involve detecting, for each signal profile in the plurality of signal profiles, the change in the signal profile corresponding to i) the signal received via the internal network path at a first detection time, and then ii) the signal received via the external network path at a second detection time; the method can further involve determining, for the plurality of signal profiles, an average detection time difference between the first detection time and the second detection time; and determining the latency in the network device can involve determining the latency in the network device based at least partly on the average detection time difference.

In some embodiments, the method can further involve operating a detector to detect data event; upon the detector detecting the data event, instructing the signal generator of the FPGA circuit to change from operating in the first mode of operation to operating in a second mode of operation; and recording in association with the data event a timestamp based on the at least one detection time measurement.

In some embodiments, the signal can be transmitted from the signal generator to the serializer along a network path; the method can further involve determining a latency of the network path; and the timestamp can be determined based at least partly on the latency of the network path.

In some embodiments, the method can further involve determining a latency of the detector detecting the data event and the instructing the signal generator of the FPGA circuit to change from operating in the first mode of operation to operating in the second mode of operation; and the timestamp can be determined further based at least partly on the latency of the detector detecting the data event and then instructing the signal generator of the FPGA circuit to change from operating in the first mode of operation to operating in the second mode of operation.

In some embodiments, the method can further involve receiving a data packet including a payload preceded by a preamble, wherein the detector can include a data reader, and operating the detector to detect the data event can involve operating the data reader to detect the preamble of the data packet.

In some embodiments, the data packet can be an Ethernet packet, the preamble is can be an Ethernet preamble, and the Ethernet packet can further include an Ethernet frame after the Ethernet preamble.

In some embodiments, the method can further involve receiving a data packet including a payload preceded by a preamble, wherein the detector can include a data reader, and operating the detector to detect the data event can involve operating the data reader to detect at least a portion of the payload of the data packet.

In accordance with an aspect of this disclosure, there is provided a signal-timing FPGA circuit. The signal-timing FPGA circuit can include a serializer for converting data streams between serial transmission and parallel transmission, the serializer comprising a serial input sampler for sampling signals received at the serializer, and a clock multiplier for changing signal frequencies; a pulse detector for detecting a change in value in the sampled signals; at least one slower portion having a slower clock speed, the slower clock speed being slower than a clock speed of the clock multiplier; a timer in communication with the serializer; and a signal generator for defining a signal profile, the signal generator having a first mode of operation and a second mode of operation, wherein the signal profile defined by the signal generator in the first mode of operation differs from the signal profile defined by the signal generator in the second mode of operation, and wherein the signal generator defines the signal profile during at least one of the first mode of operation and the second mode of operation by transmitting a signal to the serializer via the at least one slower portion. In operation, the clock multiplier provides the clock speed of the clock multiplier to the serial input sampler; the serial input sampler operates at the clock speed of the clock multiplier to sample the signal profile at the serializer; the pulse detector detects a change in the signal profile corresponding to the signal generator changing from operating in the first mode of operation to operating in the second mode of operation; and based on the pulse detector detecting the change in the signal profile, the timer determines at least one detection time measurement.

In some embodiments, the signal profile can include a non-pulse portion during the first mode of operation, and a pulse portion during the second mode of operation; the pulse portion can differ in value from the non-pulse portion of the signal profile; and in operation, the pulse detector can detect the change in the signal profile corresponding to the signal generator changing from operating in the first mode of operation to operating in the second mode of operation by detecting a change in value of the pulse portion relative to the non-pulse portion.

In some embodiments, the clock speed of the clock multiplier can be greater than 4 gigahertz.

In some embodiments, the clock speed of the clock multiplier can be greater than 15 gigahertz.

In accordance with an aspect of this disclosure, there is provided a FPGA chip including the signal-timing FPGA circuit.

In some embodiments, in operation, the serial input sampler can sample the signal profile by sampling the signal profile at the clock speed of the clock multiplier to generate a plurality of bits, each bit of the plurality of bits corresponding to a value of the signal profile during the sampling; and in operation, the pulse detector can detect the change in the signal profile corresponding to the signal generator changing from operating in the first mode of operation to operating in the second mode of operation by detecting a change in value in the plurality of bits.

In some embodiments, in operation, the timer can determine the at least one detection time measurement at least partly by counting a number of bits sampled by the serial input sampler until the change in the signal profile corresponding to the signal generator changing from operating in the first mode of operation to operating in the second mode of operation is detected.

In accordance with an aspect of this disclosure, there is provided a system for measuring the latency of a network device. The system can include the signal-timing FPGA circuit, wherein the signal-timing FPGA circuit can include an internal network path from the signal generator to the serializer without traversing the network device; a signal-transmitting connector for connecting the network device to the signal-timing FPGA circuit to provide an external network path from the signal generator to the serializer via the network device. In operation, the signal generator can transmit the signal through the internal network path and the external network path to the serializer; and the serial input sampler can sample the signal profile corresponding to the signal i) received via the internal network path, and then ii) received via the external network path; the pulse detector can detect the change in the signal profile corresponding to the signal generator changing from operating in the first mode of operation to operating in the second mode of operation, the signal profile corresponding to the signal i) received via the internal network path at a first detection time, and then ii) received via the external network path at a second detection time, the at least one detection time measurement comprising the first detection time and the second detection time.

In some embodiments, wherein in operation, the timer can determine the at least one detection time measurement at least partly by counting a number of bits sampled by the serial input sampler until the change in the signal profile corresponding to the signal generator changing from operating in the first mode of operation to operating in the second mode of operation is detected.

In some embodiments, the external network path can include a plurality of links, including the network device and at least one other link, not included in the internal network path.

In some embodiments, the internal network path and the external network path can merge at a merging link, such that, in operation, the signal transmitted through the internal network path can merge at the merging link with that signal transmitted through the external network path to create a merged signal, the merged signal defining a merged signal profile comprising two changes in the signal profile, each change in the signal profile corresponding to the signal generator changing from operating in the first mode of operation to operating in the second mode of operation; the merged signal can be transmitted to the serial input sampler; the serial input sampler can sample the merged signal profile; and the pulse detector can detect the change the signal profile corresponding to the signal generator changing from operating in the first mode of operation to operating in the second mode of operation at the first detection time and then at the second detection time by sampling the merged signal profile.

In some embodiments, the merging link can be an OR gate for merging the signal of the internal network path and the signal of the external network path to provide the merged signal.

In some embodiments, the internal network path and the external network path can share a conversion link for transmitting the signal between the merging link and the serializer; the signal generated by the signal generator can have a first signal format; the merged signal at the merging link can have the first signal format; the conversion link can include a plurality of circuit components, including at least one capacitor and at least one resistor, for converting the signal from the first signal format to a second signal format such that the serializer receives the signal in the second signal format.

In some embodiments, the plurality of circuit components can further include at least one biasing component; and converting the signal from the first signal format to the second signal format can involve modifying a voltage level of the signal.

In some embodiments, the first signal format can include a low voltage differential signaling format; and the second signal format can include a current mode logic format.

In some embodiments, the system can further include a converter operable to convert the signal generated by the signal generator from a first signal format to a second signal format required by the network device so that the signal has the second signal format when the signal traverses the network device; and convert the signal received from the network device from the second signal format back to the first signal format so that the signal has the first signal format when the signal traverses a portion of the external network path between the network device and the serializer.

In some embodiments, the first signal standard can include a first signal frequency, wherein the first signal frequency corresponds to the clock speed of the at least one portion of the FPGA circuit; and the second signal standard can include a second signal frequency within a frequency range required by the network device, wherein the second signal frequency is greater than the first signal frequency.

In some embodiments, the second signal standard can be Ethernet.

In some embodiments, in operation, the signal generator can define a plurality of signal profiles by transmitting a plurality of signals through the internal network path and the external network path to the serializer, each signal in the plurality of signals having a corresponding signal profile in the plurality of signal profiles, each signal profile in the plurality of signal profiles including a change in the signal profile corresponding to the signal generator changing from operating in the first mode of operation to operating in the second mode of operation; and the sampler can sample each signal in the plurality of signals i) received via the internal network path, and then ii) received via the external network path; the pulse detector can detect, for each signal profile in the plurality of signal profiles, the change in the signal profile corresponding to i) the signal received via the internal network path at a first detection time, and then ii) of the signal received via the external network path at a second detection time; the system can further include a processor for i) determining, for the plurality of signal profiles, an average detection time difference between the first detection time and the second detection time, and ii) determining the latency in the network device at least in part by determining the latency in the network device based at least partly on the average detection time difference.

In accordance with an aspect of this disclosure, there is provided a system for timestamping. The system can include the signal-timing FPGA circuit; a detector for i) detecting a data event, and, upon detecting the data event, ii) instructing the signal generator to change from operating in the first mode of operation to operating in the second mode of operation, the detector being in electronic communication with the signal generator; and a time-stamper for recording in association with the data event a timestamp based on the at least one detection time measurement.

In some embodiments, the signal can be transmitted from the signal generator to the serializer along a network path; and the timestamp can be determined based at least partly on a latency of the network path.

In some embodiments, the timestamp can be determined based at least partly on a latency of the detector detecting the data event and then instructing the signal generator of the FPGA circuit to change from operating in the first mode of operation to operating in the second mode of operation.

In some embodiments, the detector can include a data reader operable to receive a data packet including a payload preceded by a preamble and detect the preamble of the data packet.

In some embodiments, the data packet is can be Ethernet packet, the preamble can be an Ethernet preamble, and the Ethernet packet can further include an Ethernet frame after the Ethernet preamble.

In some embodiments, the detector can include a data reader operable to receive a data packet including a payload preceded by a preamble and detect at least a portion of the payload preamble of the data packet.

In In accordance with an aspect of this disclosure, there is provided a timestamping method. The timestamping method involves: during a first mode of operation, operating a signal generator to define a signal profile; operating a detector to detect a data event; upon the detector detecting the data event, instructing the signal generator to change from operating in the first mode of operation to operating in a second mode of operation, wherein the signal profile defined by the signal generator in the first mode of operation differs from the signal profile defined by the signal generator in the second mode of operation; operating a sampler to sample the signal profile ata frequency of at least 4 GHz to generate a plurality of bits, each bit of the plurality of bits corresponding to a value of the signal profile during the sampling; detecting the change in the signal profile corresponding to the signal generator changing from operating in the first mode of operation to operating in the second mode of operation by detecting a change in value in the plurality of bits; timing the change in the signal profile to provide at least one detection time measurement; and recording in association with the data event a timestamp based on the at least one detection time measurement.

In some embodiments, the signal profile can include a non-pulse portion during the first mode of operation, and a pulse portion during the second mode of operation. The pulse portion can differ in value from the non-pulse portion of the signal profile. Detecting the change in the signal profile corresponding to the signal generator changing from operating in the first mode of operation to operating in the second mode of operation by detecting the change in value in the plurality of bits can include detecting the change in value of the pulse portion relative to the non-pulse portion by detecting the change in value in the plurality of bits.

In some embodiments, operating the signal generator to define the signal profile can involve operating the signal generator to transmit a signal to the sampler along a network path. The method can further involve determining a latency of the network path and operating a processor to determine the timestamp based on at least the at least one detection time measurement and the latency of the network path.

In some embodiments, the method can further involve determining a latency of the detector detecting the data event and the instructing the signal generator to change from operating in the first mode of operation to operating in the second mode of operation. Operating the processor to determine the timestamp can further involve determining the timestamp based at least partly on the latency of the detector detecting the data event and then instructing the signal generator to change from operating in the first mode of operation to operating in the second mode of operation.

In some embodiments, the method can further involve storing in a computer-readable memory i) the latency of the network path, and ii) the latency of the detector detecting the data event and then instructing the signal generator to change from operating in the first mode of operation to operating in the second mode of operation. Operating the detector to detect the data event can involve operating the detector to detect each data event in a plurality of data events. Instructing the signal generator to change from operating in the first mode of operation to operating in the second mode of operation can involve instructing the signal generator such that, in operation the signal generator defines a plurality of pulse portions of the signal profile including, for each data event in the plurality of data events, an associated pulse portion of the signal profile for that data event. For example, in the first mode of operation the signal generator may not transmit a signal, while in the second mode of operation the signal generator may transmit a non-zero signal, thereby defining a plurality of pulse portions of the signal profile including, for each data event in the plurality of data events, an associated pulse portion of the signal profile for that data event. Detecting the change in value of the pulse portion relative to the non-pulse portion by detecting the change in value in the plurality of bits can involve detecting a plurality of changes in value of the plurality of pulse portions relative to a plurality of non-pulse portions. Timing the change in the signal profile to provide the at least one detection time measurement can involve providing a plurality of at least one detection time measurements including, for each data event in the plurality of data events, an associated at least one detection time measurement for that data event. The method can further involve for each data event in the plurality of data events, operating the processor to determine the timestamp based on the associated at least one detection time measurement for that data event, the latency of the network path and the latency of the detector by retrieving the latency of the network path and the latency of the detector from the computer-readable memory.

In some embodiments, the method can further involve receiving a data packet including a payload preceded by a preamble. The detector can include a data reader. Operating the detector to detect the data event can involve operating the data reader to detect the preamble of the data packet.

In some embodiments, the data packet can be an Ethernet packet, the preamble can be an Ethernet preamble, and the Ethernet packet can further include an Ethernet frame after the Ethernet preamble.

In some embodiments, the method can further involve receiving a data packet including a payload preceded by a preamble. The detector can include a data reader. Operating the detector to detect the data event can involve operating the data reader to detect at least a portion of the payload of the data packet.

In some embodiments, the sampler can be operated to sample the signal profile at a frequency greater than 15 gigahertz.

In some embodiments, timing the change in value to provide the at least one detection time measurement can involve counting a number of bits sampled until the change in the signal profile corresponding to the signal generator changing from operating in the first mode of operation to operating in the second mode of operation is detected.

In some embodiments, the method can further involve transmitting, via a conversion link, a signal between the signal generator and the sampler. The signal generated by the signal generator can have a first signal format. The conversion link can include a plurality of circuit components, including at least one capacitor and at least one resistor, for converting the signal from the first signal format to a second signal format such that the sampler receives the signal in the second signal format.

In accordance with an aspect of this disclosure, there is provided a system for timestamping. The system includes a signal generator, a detector, a sampler, a pulse detector, a timer, and a time-stamper. The signal generator can define a signal profile. The signal generator has a first mode of operation and a second mode of operation. The signal profile defined by the signal generator in the first mode of operation differs from the signal profile defined by the signal generator in the second mode of operation. The detector can i) detect a data event, and, upon detecting the data event, ii) instruct the signal generator to change from operating in the first mode of operation to operating in the second mode of operation. The detector is in electronic communication with the signal generator. The sampler can sample the signal profile at a frequency of at least 4 GHz to generate a plurality of bits. Each bit of the plurality of bits corresponds to a value of the signal profile during the sampling. The pulse detector can detect the change in the signal profile corresponding to the signal generator changing from operating in the first mode of operation to operating in the second mode of operation by detecting a change in value in the plurality of bits. The timer can time the change in the signal profile to provide at least one detection time measurement. The time-stamper can record in association with the data event a timestamp based on the at least one detection time measurement.

In some embodiments, the signal profile can include a non-pulse portion during the first mode of operation, and a pulse portion during the second mode of operation. The pulse portion can differ in value from the non-pulse portion of the signal profile. In operation, the pulse detector can detect the change in the signal profile corresponding to the signal generator changing from operating in the first mode of operation to operating in the second mode of operation by detecting a change in value of the pulse portion relative to the non-pulse portion by detecting the change in value in the plurality of bits.

In some embodiments, the system can further include a network path, a computer-readable memory, and a processor. The signal generator defining the signal profile can involve the signal generator transmitting a signal from the signal generator to the sampler along the network path. The computer-readable memory can store a latency value indicating a latency of the network path. The processor can, in operation, determine the timestamp based on at least the at least one detection time measurement and the latency of the network path. The processor can be in electronic communication with the computer-readable memory.

In some embodiments, the computer-readable memory can further store a detector latency value indicating a latency of the detector detecting the data event and then instructing the signal generator to change from operating in the first mode of operation to operating in the second mode of operation. In operation, the processor can determine the at least one detection time measurement based at least partly on the detector latency value.

In some embodiments, the computer-readable memory can further store i) the latency of the network path, and ii) the latency of the detector detecting the data event and then instructing the signal generator to change from operating in the first mode of operation to operating in the second mode of operation. In operation, the detector can detect the data event by detecting each data event in a plurality of data events. The signal generator can change from operating in the first mode of operation to operating in the second mode of operation by defining a plurality of pulse portions of the signal profile including, for each data event in the plurality of data events, an associated pulse portion of the signal profile for that data event. The pulse detector can detect the change in value of the pulse portion relative to the non-pulse portion by detecting the change in value in the plurality of bits by detecting a plurality of changes in value of the plurality of pulse portions relative to a plurality of non-pulse portions. The timer can time the change in the signal profile to provide the at least one detection time measurement by providing a plurality of at least one detection time measurements including, for each data event in the plurality of data event, an associated at least one detection time measurement for that data event. For each data event in the plurality of data events, the processor can determine the timestamp based on the associated at least one detection time measurement for that data event, the latency of the network path and the latency of the detector by retrieving the latency of the network path and the latency of the detector from the computer-readable memory.

In some embodiments, the system can further include a communication port for receiving a data packet including a data payload preceded by a preamble. The detector can include a data reader for detecting the data event by detecting the preamble of the data packet.

In some embodiments, the data packet can be an Ethernet packet, the preamble can be an Ethernet preamble, and the Ethernet packet further can further include an Ethernet frame after the Ethernet preamble.

In some embodiments, the system can further include a communication port for receiving a data packet including a data payload preceded by a preamble. The detector can include a data reader for detecting the data event by detecting at least a portion of the payload of the data packet.

In some embodiments, in operation, the sampler can sample the signal profile at a frequency greater than 15 gigahertz.

In some embodiments, in operation, the timer can determine the at least one detection time measurement at least partly by counting a number of bits sampled by the sampler until the change in the signal profile corresponding to the signal generator changing from operating in the first mode of operation to operating in the second mode of operation is detected.

In some embodiments, the system can further include a conversion link for transmitting a signal between the signal generator and the sampler. The signal generated by the signal generator can have a first signal format. The conversion link can include a plurality of circuit components, including at least one capacitor and at least one resistor, for converting the signal from the first signal format to a second signal format such that the sampler receives the signal in the second signal format.

In accordance with an aspect of this disclosure, there is provided a method of measuring latency in a network device The method can involve: providing an external network path from a start point to an end point via the network device; during a first mode of operation, operating a signal generator to define a signal profile; instructing the signal generator to change from operating in the first mode of operation to operating in a second mode of operation, wherein the signal profile defined by the signal generator in the first mode of operation differs from the signal profile defined by the signal generator in the second mode of operation, and wherein the signal profile defined by the signal generator during at least one of the first mode of operation and the second mode of operation is defined by the signal generator generating a signal, the signal being transmitted through the external network path from the start point to the end point via the network device; operating a sampler to sample the signal profile at the end point at a frequency of at least 4 GHz to generate a plurality of bits, each bit of the plurality of bits corresponding to a value of the signal profile during the sampling; detecting a change in the signal profile corresponding to the signal generator changing from operating in the first mode of operation to operating in the second mode of operation by detecting at least one change in value in the plurality of bits; timing the at least one change in value in the plurality of bits to provide at least one detection time measurement; and determining the latency in the network device based at least partly on the at least one detection time measurement.

In some embodiments, the signal profile can include a non-pulse portion during the first mode of operation, and a pulse portion during the second mode of operation; the pulse portion can differ in value from the non-pulse portion of the signal profile; and, detecting the change in the signal profile corresponding to the signal generator changing from operating in the first mode of operation to operating in the second mode of operation by detecting the at least one change in value in the plurality of bits can involve detecting the change in value of the pulse portion relative to the non-pulse portion by detecting the at least one change in value in the plurality of bits.

In some embodiments, the external network path can include a plurality of links, including the network device and at least one other link; the method can further involve determining a latency of the at least one other link; and in addition to the at least one detection time measurement, the latency in the network device can be determined based at least partly on the latency of the at least one other link.

In some embodiments, the method can further involve providing an internal network path from the start point to the end point without traversing the network device such that the signal generated by the signal generator is transmitted through the internal network path.

In some embodiments, the internal network path and the external network path can merge at a merging link; the signal transmitted through the internal network path can merge at the merging link with the signal transmitted through the external network path to create a merged signal, the merged signal defining a merged signal profile including two pulse portions, each pulse portion of the two pulse portions including the change in value of the pulse portion relative to the non-pulse portion of the merged signal profile; detecting the at least one change in value in the plurality of bits and timing the at least one change in value to provide the at least one detection time measurement can further involve sampling the merged signal profile at the end point and detecting the change in value of the pulse portion relative to the non-pulse portion at a first detection time, the first detection time being based on a latency of the internal network path; and subsequent to the first detection time, sampling the merged signal profile at the end point and detecting the change in value of the pulse portion relative to the non-pulse portion at a second detection time to determine a detection time difference between the first detection time and the second detection time, the second detection time being based on a latency of the external network path; and the at least one detection time measurement can include the first detection time, the second detection time, and the detection time difference.

In some embodiments, determining the detection time difference can involve counting a number of bits sampled between the first detection time and the second detection time.

In some embodiments, the merging link can be an OR gate for merging the signal of the internal network path and the signal of the external network path to provide the merged signal.

In some embodiments, the internal network path and the external network path can share a conversion link for transmitting the merged signal between the merging link and the sampler; the signal generated by the signal generator can have a first signal format; the merged signal at the merging link can have the first signal format; the conversion link can include a plurality of circuit components, including at least one capacitor and at least one resistor, for converting the signal from the first signal format to a second signal format such that the sampler receives the signal in the second signal format.

In some embodiments, defining the signal profile can involve defining a plurality of signal profiles by operating the signal generator to generate a plurality of signals, each signal in the plurality of signals having a corresponding signal profile in the plurality of signal profiles, the plurality of signals being transmitted through the internal network path and the external network path to the end point, each signal profile in the plurality of signal profiles including a pulse portion and a non-pulse portion, the pulse portion including a change in value relative to the non-pulse portion of the signal profile; sampling the signal profile at the end point can involve sampling each signal profile in the plurality of signal profiles by sampling each signal in the plurality of signals i) received via the internal network path, and then ii) received via the external network path; detecting the change in value of the pulse portion can involve detecting, for each signal profile in the plurality of signal profiles, the change in value relative to the respective non-pulse portion i) of the pulse portion corresponding to the signal received via the internal network path at a first detection time, and then ii) of the pulse portion corresponding to the signal received via the external network path at a second detection time; the method can further involve determining, for the plurality of signals, an average detection time difference between the first detection time and the second detection time; and determining the latency in the network device can involve determining the latency in the network device based at least partly on the average detection time difference.

In some embodiments, the sampler can be operated to sample the signal profile at a frequency greater than 5 gigahertz.

In some embodiments, the method can further involve determining that the signal generated by the signal generator has a first signal format different than a second signal format required by the network device; converting the signal from the first signal format to the second signal format so that the signal has the second signal format when the signal traverses the network device; and converting the signal received from the network device from the second signal format back to the first signal format so that the signal has the first signal format when the signal traverses a portion of the external network path between the network device and the sampler.

In accordance with an aspect of this disclosure, there is provided a system for measuring the latency of a network device. The system can include: a signal generator for defining a signal profile, the signal generator having a first mode of operation and a second mode of operation, wherein the signal profile defined by the signal generator in the first mode of operation differs from the signal profile defined by the signal generator in the second mode of operation, and wherein the signal generator defines the signal profile during at least one of the first mode of operation and the second mode of operation by generating a signal; a sampler for sampling the signal profile defined by the signal generator at a frequency of at least 4 GHz to generate a plurality of bits, each bit of the plurality of bits corresponding to a value of the signal profile during the sampling; a pulse detector for detecting a change in the signal profile corresponding to the signal generator changing from operating in the first mode of operation to operating in the second mode of operation by detecting at least one change in value in the plurality of bits; a timer, in communication with the pulse detector, for timing the at least one change in value in the plurality of bits to provide at least one detection time measurement; and a signal-transmitting connector for electronically linking the signal generator and the sampler to the network device to provide an external network path for transmitting the signal from the signal generator to the sampler via the network device.

In some embodiments, the signal profile can include a non-pulse portion during the first mode of operation, and a pulse portion during the second mode of operation; the pulse portion can differ in value from the non-pulse portion of the signal profile; and in operation, the pulse detector can detect the change in the signal profile corresponding to the signal generator changing from operating in the first mode of operation to operating in the second mode of operation by detecting a change in value of the pulse portion relative to the non-pulse portion by detecting the at least one change in value in the plurality of bits.

In some embodiments, the external network path can include a plurality of links, including the network device and at least one other link; the system can further include a processor for determining the latency of the at least one other link.

In some embodiments, the system can further include an internal network path for transmitting the signal from the signal generator to the sampler without traversing the network device.

In some embodiments, the system can further include a merging link for merging the internal network path and the external network path, wherein, in operation, the signal transmitted through the internal network path can merge at the merging link with the signal transmitted through the external network path to create a merged signal, the merged signal can define a merged signal profile including two pulse portions, each pulse portion of the two pulse portions including the change in value of the pulse portion relative to the non-pulse portion of the merged signal profile; the sampler can sample the merged signal profile; the pulse detector can detect the change in value of the pulse portion relative to the non-pulse portion at a first detection time, the first detection time being based on a latency of the internal network path; subsequent to the first detection time, the pulse detector can detect the change in value of the pulse portion relative to the non-pulse portion at a second detection time, the second detection time based on a latency of the external network path; and the timer can determine a detection time difference between the first detection time and the second detection time, the at least one detection time measurement including the first detection time, the second detection time, and the detection time difference.

In some embodiments, in operation, the timer determining the detection time difference can involve the timer counting a number of bits sampled between the first detection time and the second detection time.

In some embodiments, the merging link can be an OR gate for merging the signal of the internal network path and the signal of the external network path to provide the merged signal.

In some embodiments, the internal network path and the external network path can share a conversion link for transmitting the merged signal between the merging link and the sampler; the signal generated by the signal generator can have a first signal format; the merged signal at the merging link can have the first signal format; and the conversion link can include a plurality of circuit components, including at least one capacitor and at least one resistor, for converting the signal from the first signal format to a second signal format such that the sampler receives the signal in the second signal format.

In some embodiments, in operation, the signal generator can define a plurality of signal profiles by generating a plurality of signals, each signal in the plurality of signals having a corresponding signal profile in the plurality of signal profiles, the plurality of signals being transmitted through the internal network path and the external network path, each signal profile in the plurality of signal profiles including a pulse portion and a non-pulse portion, the pulse portion including a change in value relative to the non-pulse portion of the signal profile; the sampler can sample each signal profile in the plurality of signals profiles by sampling each signal in the plurality of signals received via i) the internal network path, and then ii) received via the external network path; the pulse detector can detect, for each signal profile in the plurality of signal profiles, the change in value relative to the respective non-pulse portion i) of the pulse portion corresponding to the signal received via the internal network path at a first detection time, and then ii) of the pulse portion corresponding to the signal received via the external network path at a second detection time; and the system can further include a processor for i) determining, for the plurality of signal profiles, an average detection time difference between the first detection time and the second detection time, and ii) determining the latency in the network device at least in part by determining the latency in the network device based at least partly on the average detection time difference.

In some embodiments, in operation, the sampler can sample the signal profile at a frequency greater than 15 gigahertz.

In some embodiments, the system can further include a first signal converter for converting signals from a first signal format to a second signal format so that the signal has the second signal format when the signal traverses the network device; and a second signal converter for converting signals received from the network device from the second signal format back to the first signal format so that the signal has the first signal format when the signal traverses a portion of the external network path between the network device and the sampler.

It will be appreciated that the aspects and embodiments may be used in any combination or sub-combination. Further aspects and advantages of the embodiments described herein will appear from the following description taken together with the accompanying drawings.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which:

FIGS. 3A, 3B, 3C, and 3D are diagrams illustrating an example operation of the of the signal-timing FPGA circuit shown in FIG. 1, in accordance with an embodiment;

Figure 1:
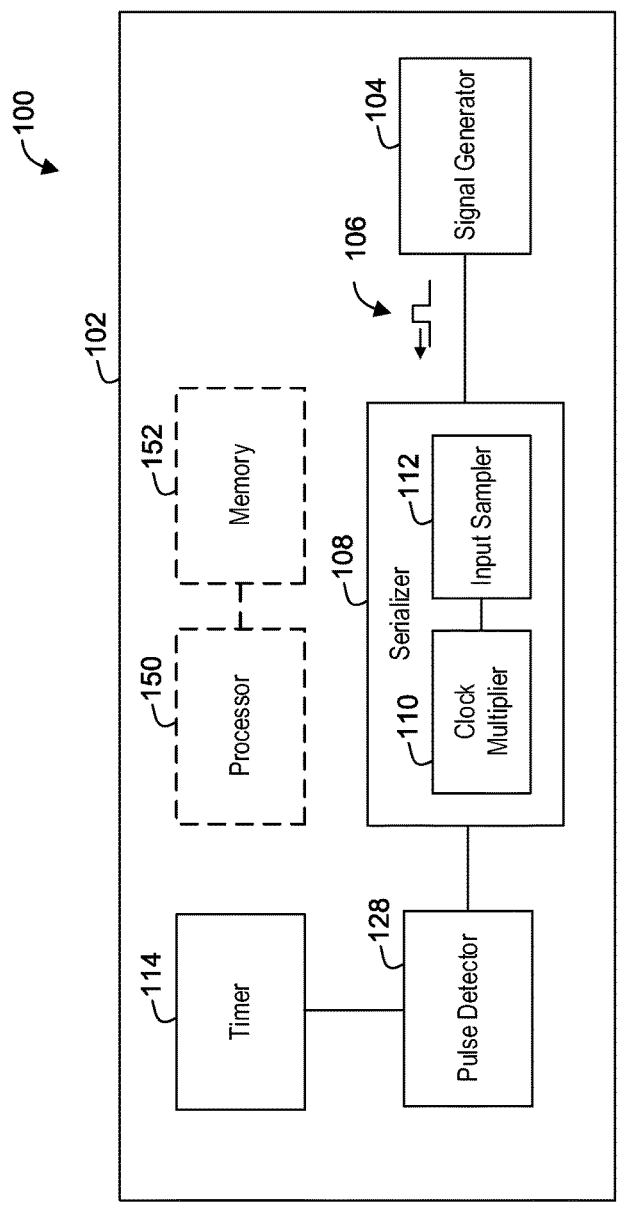
FIG. 1 is a block diagram of an example signal-timing FPGA circuit, in accordance with an embodiment.

The skilled person in the art will understand that the drawings, described below, are for illustration purposes only. The drawings are not intended to limit the scope of the applicants' teachings in any way. Also, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF VARIOUS EMBODIMENTS

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more elements are said to be "coupled", "connected", "attached", or "fastened" where the parts are joined or operate together either directly or indirectly (i.e., through one or more intermediate parts), so long as a link occurs. As used herein and in the claims, two or more elements are said to be "directly coupled", "directly connected", "directly attached", or "directly fastened" where the element are connected in physical contact with each other. None of the terms "coupled", "connected", "attached", and "fastened" distinguish the manner in which two or more elements are joined together.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The embodiments of the systems and methods described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface. For example and without limitation, the programmable computers may be a server, network appliance, embedded device, computer expansion module, a personal computer, laptop, personal data assistant, cellular telephone, smartphone device, tablet computer, a wireless device or any other computing device capable of being configured to carry out the methods described herein.

In some embodiments, the communication interface may be a network communication interface. In embodiments in which elements are combined, the communication interface may be a software communication interface, such as those for inter-process communication (IPC). In still other embodiments, there may be a combination of communication interfaces implemented as hardware, software, and combination thereof.

Program code may be applied to input data to perform the functions described herein and to generate output information. The output information is applied to one or more output devices, in known fashion.

Each program may be implemented in a high-level procedural or object oriented programming and/or scripting language, or both, to communicate with a computer system. However, the programs may be implemented in assembly or machine language, if desired. In any case, the language may be a compiled or interpreted language. Each such computer program may be stored on a storage media or a device (e.g. ROM, magnetic disk, optical disc) readable by a general or special purpose programmable computer, for configuring and operating the computer when the storage media or device is read by the computer to perform the procedures described herein. Embodiments of the system may also be considered to be implemented as a non-transitory computer-readable storage medium, configured with a computer program, where the storage medium so configured causes a computer to operate in a specific and predefined manner to perform the functions described herein.

Furthermore, the system, processes and methods of the described embodiments are capable of being distributed in a computer program product comprising a computer readable medium that bears computer usable instructions for one or more processors. The medium may be provided in various forms, including one or more diskettes, compact disks, tapes, chips, wireline transmissions, satellite transmissions, internet transmission or downloadings, magnetic and electronic storage media, digital and analog signals, and the like. The computer useable instructions may also be in various forms, including compiled and non-compiled code.

The various embodiments described herein generally relate to timing a signal. Timing a signal can be useful in a wide variety of applications, including applications that require high temporal precision and/or low latency, such as high-frequency trading. For example, timing a signal can be useful in measuring latency and/or timestamping.

The accuracy or precision of timing a signal (and the corresponding latency measurement or timestamp) may be limited by the clock speed or frequency of the timing system. The clock speed or frequency of a system typically refers to the number of tasks or instructions that the system can execute per second. Accordingly, the clock speed of the timing system can dictate how quickly the system can time a signal, and the resolution of the timing. For example, modern FPGAs (field-programmable gate arrays) may have a clock speed of approximately 300 megahertz and may accordingly only be able to time a signal with approximately 3.3 nanosecond precision.

As will be described in greater detail below, the various embodiments described herein can operate at very high frequencies, such as over 4 gigahertz, or in some embodiments, over 15 gigahertz. For example, some embodiments described herein involve reconfiguring the serializer of a FPGA circuit to operate at frequencies greater than 4 gigahertz, or in some embodiments, over 15 gigahertz. The various systems and methods described herein can time signals, perform latency measurements, and generate timestamps with high temporal precision, such as less than 0.25 nanoseconds.

Referring now to FIG. 1, there is a provided a block diagram 100 of an example signal-timing FPGA circuit 102. Although a FPGA circuit is shown, non-FPGA circuits providing all of the necessary functions may alternatively be used. The FPGA circuit 102 can include a variety of electronic components that are connected by a variety of electronic connections. The FPGA circuit 102 can be implemented as an integrated circuit (IC), chip, and/or microchip. For instance, the FPGA circuit 102 can be implemented as a set of electronic circuits on a semiconductor material, connected by conductive traces or wires. The FPGA circuit 102 can include a variety of electronic components that are reconfigurable (i.e., field programmable) to perform different functions. Each component of the FPGA circuit 102 can receive a clock signal from a clock generator (not shown) and operate at the frequency of the clock signal. As shown in FIG. 1, the FPGA circuit 102 includes a signal generator 104, a serializer 108, a pulse detector 128, and a timer 114.

The signal generator 104 can define a signal profile 106, which can be sampled by the serializer 108. The signal profile 106 can be defined by the signal generator 104 generating a signal and transmitting the generated signal to the serializer 108. The signal generated by the signal generator 104 can be any electronic signal. The signal can be repeating or non-repeating. The signal may be analog or digital. The signal generator 104 can generate the signal to have any waveform, amplitude, phase, and/or frequency. In some cases, the signal profile 106 can be defined by the signal generator 106 not generating or transmitting a signal. That is, the signal profile 106 can be defined by the absence or lack of a signal provided by the signal generator 104 (this can be thought of as a notional signal having a constant magnitude of zero).

The signal generator 104 can have different modes of operation and define different signal profiles 106 depending on its mode of operation. For example, the signal generator 104 can generate a first signal during a first mode of operation and generate a second signal during a second mode of operation. The second signal can have one or more different properties from the first signal, such as, magnitude, frequency, etc. In another example, during at least one of a first mode of operation and a second mode of operation, the signal generator 104 defines the signal profile 106 by generating a signal. For instance, during a first mode of operation, no signal is generated by signal generator 104, and during a second mode of operation, a signal is generated by the signal generator 104. In some embodiments, the signal generator 104 can generate a signal profile having a non-pulse portion during a first mode of operation and a pulse portion during a second mode of operation.

Figure 2:
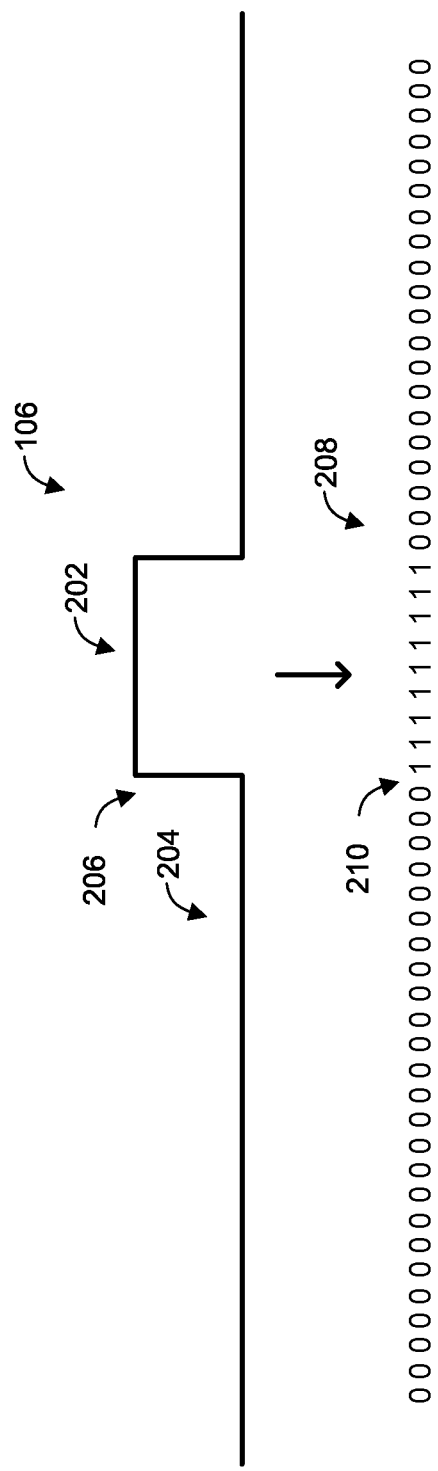
FIG. 2 is a diagram illustrating an example signal generated by the signal-timing FPGA circuit shown in FIG. 1, in accordance with an embodiment.

Referring now to FIG. 2, there is shown an example signal profile 106 that can be defined by the signal generator 104, or an analogous non-FPGA signal generator. FIG. 2 shows a waveform representation of the signal profile 106, illustrating the amplitude of the signal profile 106 with respect to time. As shown in FIG. 2, the signal profile 106 can include a pulse portion 202 (e.g., corresponding to the second mode of operation of the signal generator 104) and a non-pulse portion 204 (e.g., corresponding to the first mode of operation of the signal generator 104). The pulse portion 202 differs in value from the non-pulse portion 204 of the signal profile 106. The pulse portion 202 is typically a relatively small portion of the waveform of the signal profile 106 and can represent a rapid change in the amplitude of the signal profile 106 from a baseline value (e.g., the non-pulse portion 204) to higher or lower value (e.g., the pulse portion 202).

In some embodiments, the pulse portion 202 of the single profile 106 can be defined by the signal generator 104 generating a signal, while the non-pulse portion 204 of the signal profile 106 can be defined by absence of a signal being generated by the signal generator 104 (that is, as a notional signal having a constant magnitude of zero).

The signal profile 106 is shown in FIG. 2 to have a positive rectangular pulse portion 202 for ease of illustration. It should be appreciated that the signal generator 104 may define other types of signal profiles, depending on its mode of operation. For example, the pulse portion 202 of the signal profile 106 may have different shapes, such as, but not limited to cosine squared (raised cosine), or sinc. As another example, the pulse portion 202 may have a smaller amplitude than the non-pulse portion 204. It should be appreciated that various types of signals are possible so long as the signal profile defined by the signal generator 104 during the first mode of operation differs from the signal profile defined by the signal generator 104 during the second mode of operation.

In some embodiments, the signal generator 104 can first operate in the first mode of operation (e.g., and define the non-pulse portion 204). The signal generator 104 can then switch to the second mode of operation (e.g., and define the pulse portion 202) in response to an instruction from one or more other components of the FPGA circuit 102.

Referring back to FIG. 1, the serializer 108 can sample the signal profile 106 defined by the signal generator 104 by receiving the signals (or lack thereof) generated and transmitted by the signal generator 104. The serializer 108 includes a serial input sampler 112 and a clock multiplier 110. The serial input sampler 112 can sample signal profiles defined by signals (or lack thereof) received at the serializer 108, such as the signal profile 106. The clock multiplier 110 can change signal frequencies, such as a clock signal.

The serializer 108 can convert data streams between serial transmission and parallel transmission, or vice versa. That is, the serializer 108 can deserialize a single serial data stream into a number of parallel data streams, or serialize a number of parallel data streams into a single serial data stream. The serializer 108 may be referred to as a deserializer or a SerDes (serializer/deserializer). The serializer 108 can include a SIPO (serial in parallel out) block and a PISO (parallel in serial out) block (not shown). The number of parallel bits that can be input or output to or from the serializer 108 at one time (i.e., when converting a serial signal to a parallel signal, or vice versa) may be referred to as the bus size of the serializer 108. In some embodiments, the serializer 108 can have a bus size of eighty bits.

In order to convert a single serial data stream into a number of parallel data streams with the same bitrate, some components of the serializer 108 can operate at a higher clock speed than other components of the FPGA circuit 102. For example, if the serializer 108 has a bus size of eighty bits (i.e., can convert a single serial data stream into eighty parallel data streams), the serializer 108 can read eighty bits in the serial data stream in the time that one bit is output to each of the parallel data streams. That is, in this example, the serializer 108 can sample the serial data stream at a speed that is eighty times faster than the parallel data streams are output by the serializer 108.

The clock multiplier 110 of the serializer 108 can be configured to have a faster clock speed than other components of the FPGA circuit 102. The clock multiplier 110 can receive the clock signal from clock generator (not shown) and increase the frequency of the clock signal to provide a faster clock speed. For example, the clock speed of some of the components of the FPGA circuit 102 may be less than 1 gigahertz, whereas the clock speed of the clock multiplier 110 may be greater than 4 gigahertz or, in some embodiments, greater than 15 gigahertz. The clock multiplier 110 can include components such as, but not limited to, a PLL (phase-locked loop) or a CMUPLL (clock multiplier unit phase-locked loop).

Accordingly, one or more portions of the FPGA circuit 102 can have a clock speed lower than the clock speed of the clock multiplier 110. A portion of the FPGA circuit 102 that has the lower clock speed may be referred to as a slower portion of the FPGA circuit 102. For example, the signal generator 104 can transmit a signal to define the signal profile 106 to the serializer 108 via a slower portion of the FPGA circuit 102. In some embodiments, the slower portion of the FPGA circuit 102 can include all of the components of the FPGA circuit 102 other than the serializer 108.

The clock multiplier 110 can be configured to provide its clock speed to various components of the serializer 108, such as the serial input sampler 112. As a result, the serial input sampler 112 can be configured to operate at the clock speed of the clock multiplier 110. Configuring the serial input sampler 112 to receive a clock speed from the clock multiplier 110 may be referred to as a "locked-to-reference mode" of the serializer 108.

The serial input sampler 112 can operate at the clock speed of the clock multiplier 110 to sample the signal profile 106. The serial input sampler 112 can sample the signal profile 106 by measuring the value of the signal profile 106 (e.g., the value of the signal or lack thereof) at a number of discrete points. The serial input sampler 112 can sample the signal profile 106 during each clock cycle of the clock signal provided by the clock multiplier 110. Accordingly, the number of samples measured by the serial input sampler 112 can correspond to the clock speed of the serial input sampler 112. That is, a higher clock speed typically corresponds to a larger number of measurements. The serial input sampler 112 can convert the continuous signal profile 106 into a discrete representation of the signal profile 106.

The pulse detector 128 can detect the change in the signal profile 106 corresponding to the signal generator 104 changing from operating in the first mode of operation to operating in the second mode of operation. For example, the pulse detector 128 can detect the pulse portion 202 of the signal profile 106 by detecting a change in the value of the pulse portion 202 relative to the non-pulse portion 204.

Referring again to FIG. 2, the serial input sampler 112 (or an analogous non-FPGA sampler) can sample the signal profile 106 to produce a plurality of measurements 208 of the value of the signal profile 106. The pulse detector 128 can detect the change to the second mode of operation (e.g., the change to the pulse portion 202 at 206), by determining the measurement 210 where the signal profile 106 transitions from the first mode of operation (e.g., the non-pulse portion 204) to the second mode of operation (e.g., the pulse portion 202).

As shown in FIG. 2, the serial input sampler 112 (or an analogous non-FPGA sampler) can sample the signal profile 106 to generate a plurality of bits 208. Each bit of the plurality of bits 208 corresponds to a value of the signal profile 106 during the sampling. The number of bits in the plurality of bits 208 can correspond to the clock speed of the serial input sampler 112. That is, the serial input sampler 112 can generate a bit for each cycle of the clock signal provided by the clock multiplier 110 as it samples the signal profile 106. The pulse detector 128 can detect the change in the signal profile 106 from the signal generator 104 changing from operating in the first mode of operation to operating in the second mode of operation by detecting a change in the value in the plurality of bits 208. For example, the pulse detector 128 can detect the change in value of the pulse portion 202 relative to the non-pulse portion 204 by detecting a change in value in the plurality of bits 208. The pulse detector 128 can detect the pulse portion 202, for example, by detecting the bit that represents the change in value from the non-pulse portion 204 to the pulse portion 202 (e.g., at 210).

It should be appreciated that the plurality of bits 208 is shown in FIG. 2 for ease of exposition. The serial input sampler 112 may generate various other types of data in response to sampling the signal profile 106. For example, the serial input sampler 112 may sample the signal profile 106 to generate a plurality of integers, floating points, etc.

In some cases, the plurality of bits 208 may contain errors. That is, the plurality of bits may contain a bit that is a zero that should be a one, or vice versa. The errors can be caused by imperfections in the FPGA circuit 102, such as defects in the connection between the signal generator 104 and the serializer 108. To address these situations, the pulse detector 128 may be configured to only detect the change to the second mode of operation (e.g., the pulse portion 202) when a predetermined threshold is exceeded. For example, the pulse portion 202 may only be detected when the change in value in the plurality of bits 208 exceeds a minimum number of bits. Accordingly, a single bit that has a different value than its neighboring bits may be ignored, and the pulse portion 202 may only be detected when there is a minimum number of bits in a row.

Referring back to FIG. 1, the timer 114 is in communication with the pulse detector 128. The timer 114 can determine one or more detection time measurements for the pulse portion 202. That is, the timer 114 can time the change in the signal profile 106 (e.g., of the pulse portion 202 relative to the non-pulse portion 204 corresponding to the change in the operational mode of the signal generator 104) to provide one or more detection time measurements. For example, the timer 114 can determine a particular sample associated with the detection of the pulse portion 202, and determine a time associated with the collection of that sample.

The timer 114 can determine the detection time measurement at least partly by counting a number of bits sampled by the serial input sampler 112 until the change in the signal profile 106 (e.g., the pulse portion 202) is detected. For instance, referring again to FIG. 2, each bit in the plurality of bits 208 can correspond to a segment of time, depending on the clock speed of the serial input sampler 112. For example, if the serial input sampler 112 has a clock speed of 30 gigahertz, the serial input sampler 112 can sample the signal 104 every 33.3 picoseconds. Accordingly, each bit can correspond to a 33.3 picosecond time interval. The timer 114 can count the number of bits starting from a bit corresponding to a reference point, and ending at the bit 210 corresponding to the change in the operational mode of the signal generator 104 (e.g., the pulse portion 202), to determine the detection time measurement. The reference point can be any point with which the detection time is measured relative to. The timer 114 can determine the detection time measurement by multiplying the number of bits from the reference point to the change in the signal profile 106 (e.g., the pulse portion 202) by the amount of time corresponding to a single bit.

Referring again to FIG. 1, in some embodiments, the timer 114 can include a ticker (not shown). The ticker can store and update a value that represents an amount of time. The value stored by the ticker can be continuously incremented at a constant rate. Each increment may be referred to as a tick. The value of the ticker can be reset to zero (and the ticker can be instructed to begin ticking) at a time corresponding to a reference point for a time measurement. In some embodiments, the value of the ticker can be used to determine the current time, for example, based on a known time of the reference point.

The ticker can be incremented at a relatively low frequency, for example, slower than the sampling frequency of the serial input sampler 112 (e.g., the clock speed of the clock multiplier 110). In some embodiments, the ticker is a part of the slower portion of the FPGA circuit 102.

For example, referring to FIG. 3A, there is shown a timeline 300 that illustrates a segment of time 302 that corresponds to an increment of the ticker (or an analogous non-FPGA ticker). As shown in FIG. 3A, at 302, the ticker stores the value n. As time advances, the ticker can update the value to n+1, . . . n+m.

Within each increment of the ticker, the serial input sampler 112 can generate a group of bits 350 while generating the plurality of bits 208 while sampling the signal profile 106. For example, while the ticker stores the value n, the serial input sampler 112 can generate a bit during each of j, j+1, . . . j+k. As shown in FIG. 3B, each group of bits 350 can correspond to a tick of the ticker (i.e., n, n+1, . . . n+m). In some embodiments the group of bits 350 can include eighty bits. The number of bits in a group of bits 350 typically corresponds to the bus size of the serializer 108.

In some embodiments, the timer 114 can determine a detection time measurement based at least partly on the value of the ticker. For example, at a particular reference time, the ticker can begin ticking. At some future time, subsequent to the reference time, the serial input sampler 112 can detect the change in the signal profile 106 (e.g., the pulse portion 202). The timer can determine a detection time based on the value of the ticker as well as the bits within one or more groups of bits 350.

Figure 3C:
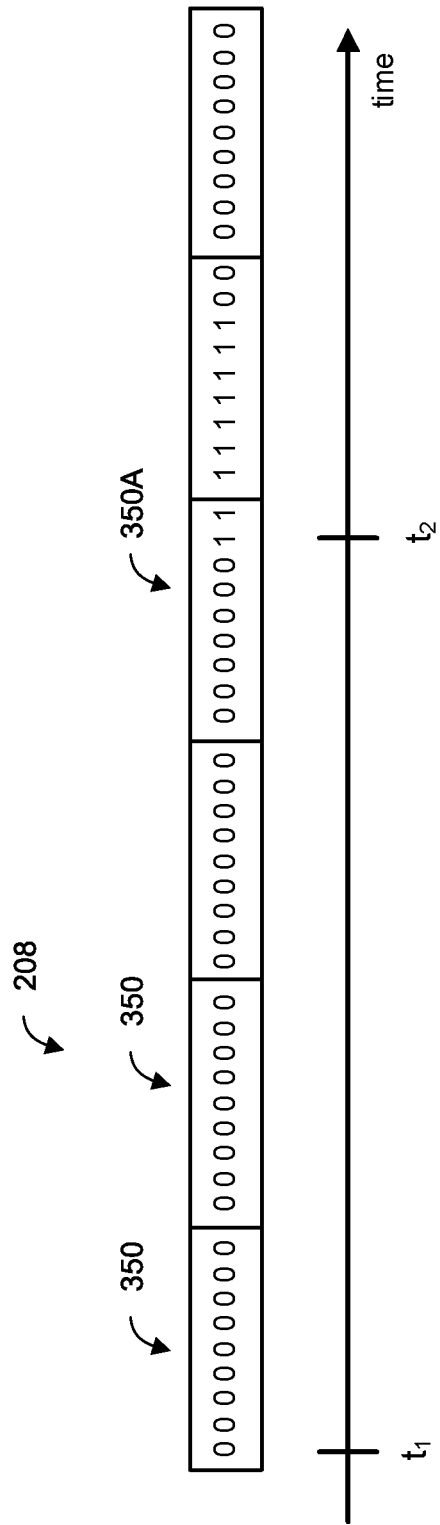

For example, referring to FIG. 3C, the ticker can reset the stored value to zero and begin incrementing the stored value at a reference time, $t_1$. As the serial input sampler 112 samples the signal profile 106, it generates a plurality of bits 208. Groups of bits 350 within the plurality of bits 208 correspond to particular values or ticks of the ticker. At $t_2$, the serial input sampler 112 (or pulse detector) detects the change in the signal profile 106 (e.g., the pulse portion 202) by detecting a change in value in the plurality of bits 208. The timer 114 can determine a detection time measurement based on the value of the ticker at $t_2$ and the group of bits 350A corresponding to the value of the ticker at $t_2$.

For instance, as shown in FIG. 3C, the ticker has been incremented by four ticks from $t_1$ to $t_2$ (the time difference from $t_1$ to $t_2$ is 4 ticks minus 2 bits). Within the group of bits 350A corresponding to the tick at $t_2$, the change in value is detected after the seventh bit. Assuming each tick corresponds to 0.3 nanoseconds, and each bit corresponds to 33.3 picoseconds (with each tick corresponding to a group of 9 bits), a detection time measurement can be determined to be 4 ticks×0.3 nanoseconds/tick−2 bits×33.3 picoseconds/bit.

In some cases, the reference point can occur in between successive ticks of the ticker. For example, referring to FIG. 3D, the ticker does not begin incrementing at the reference time $t_1$. In this case, the timer 114 can determine the detection time based on the value of the ticker at $t_2$, the group of bits 350A corresponding to the value of the ticker at $t_2$, and the group of bits 350B corresponding to the value of the ticker at $t_1$.

Figure 3D:
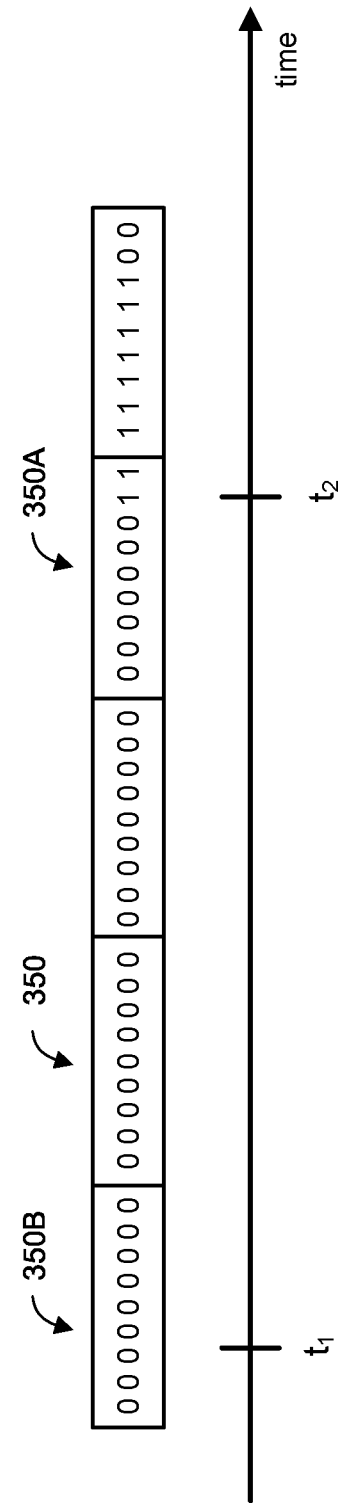

For instance, as shown in FIG. 3D, the ticker has been incremented by four ticks from $t_1$ to $t_2$, where the tick count begins at the tick beginning before, and including, $t_1$. Within the group of bits 350B corresponding to the tick at $t_1$, the reference time $t_1$ occurs after the third bit. Within the group of bits 350A corresponding to the tick at $t_2$, the change in value is detected after the seventh bit. Assuming each tick corresponds to 0.3 nanoseconds, and each bit corresponds to 33.3 picoseconds, a detection time measurement can be determined to be 4ticks×0.3 nanoseconds/tick−2 bits×33.3 picoseconds/bit−3 bits×33.3 picoseconds/bit.

Referring again to FIG. 1, the FPGA circuit 102 can, in some embodiments, include a processor 150 and memory 152. The processor 150 can be any suitable electronic component for performing one or more operations on data. The processor 150 can receive data from the various other components of the FPGA circuit 102 and perform various processing on the received data. For example, the processor 150 can receive detection time measurements from the timer 114 and adjust the detection time measurements to account for various latencies of one or more components of the FPGA circuit 102. In another example, the processor 150 can receive a plurality of detection time measurements from the timer 114 and determine an average detection time measurement. In some embodiments, the processor 150 can control and/or reconfigure one or more of the components of the FPGA circuit 102. The memory 152 can be any suitable component for storing data for use with the FPGA circuit 102. The memory 152 can also receive data from the various other components of the FPGA circuit 102 and store the received data. For example, the memory 152 can store detection time measurements from the timer 114 or the processed detection time measurements from the processor 150. The memory 152 may, in some embodiments, store latencies associated with one or more components of the FPGA circuit 102 that are more or less constant.

Figure 4:
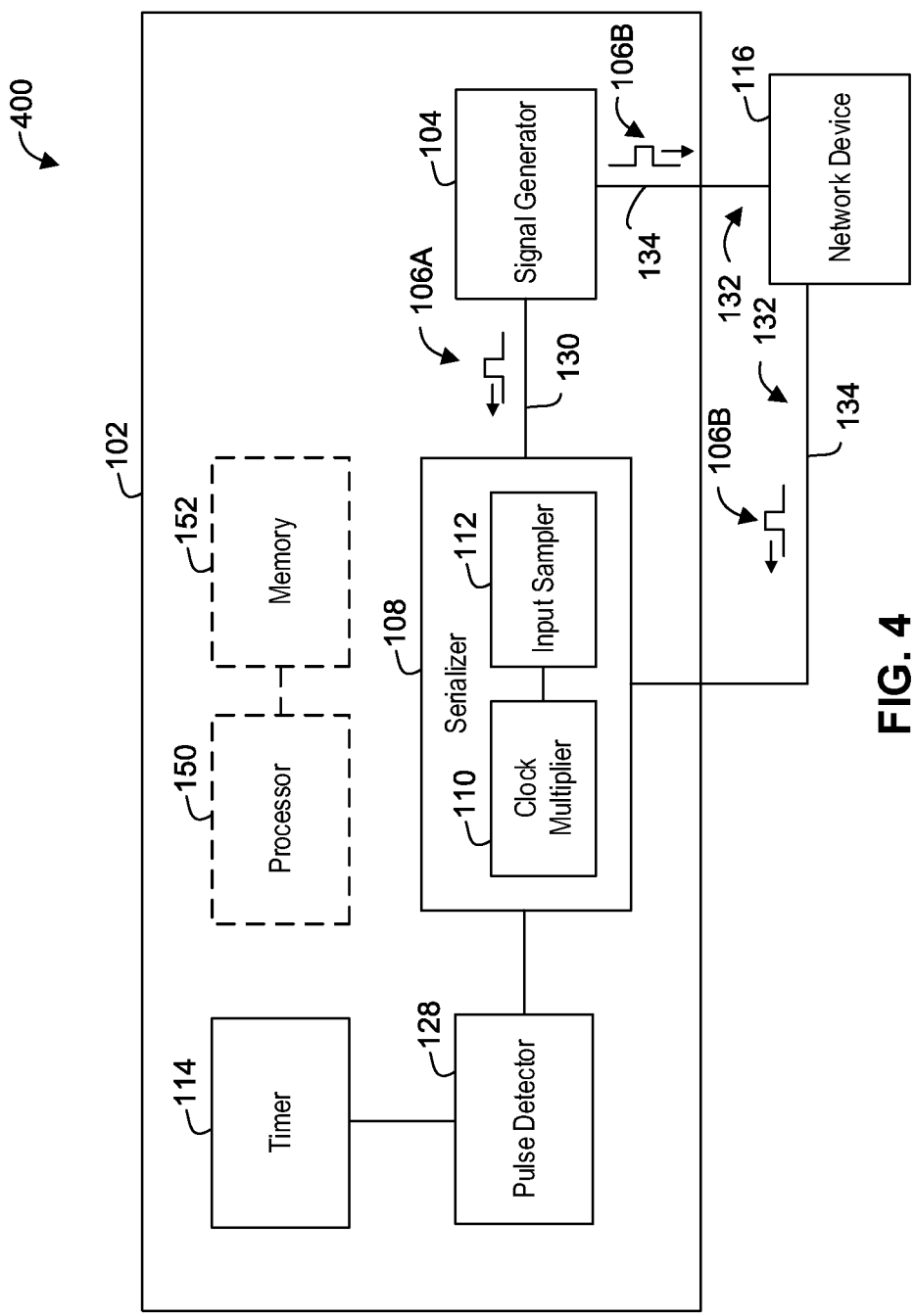
FIG. 4 is a block diagram of another example of the signal-timing FPGA circuit shown in FIG. 1, in accordance with an embodiment.

Reference is now made to FIG. 4, which shows a diagram 400 of another example of a FPGA circuit 102. Although a FPGA circuit is shown, non-FPGA circuits providing all of the necessary functions may alternatively be used. The FPGA circuit 102 shown in FIG. 4 is similar to the FPGA circuit 102 shown in FIG. 1, except that the FPGA circuit 102 is now connected to a network device 116. The FPGA circuit 102 can be used to measure the latency of the network device 116.

The network device 116 can be any device that can be used in a computer network. For example, the network device 116 can comprise, but is not limited to, routers, processors, cables, loopbacks, and cross-point switches. The network device 116 can have a latency. That is, the network device 116 can cause a time delay when data is transferred through the network device 116. The latency of the network device 116 can be caused by the various functions of the network device 116, such as, but not limited to, data transmission and data processing.

As shown in FIG. 4, the FPGA circuit 102 can include an internal network path 130 from the signal generator 104 to the serializer 108. The internal network path 130 does not traverse the network device 116. A signal-transmitting connector 132 can connect the network device 116 to the FPGA circuit 102. The signal-transmitting connector 132 can provide an external network path 134 from the signal generator 104 to the serializer 108 via the network device 116.

The signal generator 104 can provide the same signal profile 106 to the serializer 108 through both the internal network path 130 and the external network path 134 (e.g., by transmitting a signal, or by not transmitting a signal via the network paths). As shown in FIG. 4, the version of the signal profile 106 that is provided by the signal generator 104 via the internal network path 130 is indicated as signal profile 106A. The version of the signal profile 106 provided by the signal generator 104 via the external network path 134 is indicated as signal profile 106B. It should be appreciated that the signal profile 106A is the same as the signal profile 106B. For example, each of the signal profile 106A and the signal profile 106B can include a pulse portion 202 and a non-pulse portion 204.

However, the signals corresponding to the signal profile 106A are typically received by the serializer 108 before the signals corresponding to the signal profile 106B. This is because the arrival of the signals corresponding to the signal profile 106B is typically delayed by the latency of the network device 116.

The serial input sampler 112 can sample the signal profile 106A and the pulse detector 128 can detect the change in the signal profile 106A (e.g., the change in value of the pulse portion 202 relative to the non-pulse portion 204) corresponding to the signal received via the internal network path 130 at a first detection time. The serial input sampler 112 can then sample the signal profile 106B and the pulse detector 128 can then detect the change in the signal profile 106B (e.g., the pulse portion 202 relative to the non-pulse portion 204) corresponding to the signal received via the external network path 134 at a second detection time. In some embodiments, the serial input sampler 112 can sample the signal profiles 106A, 106B to generate a plurality of bits 208. The pulse detector 128 can detect change in the signal profiles 106A, 106B (e.g., the pulse portions 202) by detecting changes in value in the plurality of bits 208.

The timer 114 can time the change in the signal profile 106A and the signal profile 106B (e.g., the change in value of the pulse portions 202 relative to the non-pulse portions 204) to determine one or more detection time measurements. For example, the detection time measurement may include the first detection time (e.g., corresponding to signal profile 106A and the latency of the internal network path 130) and the second detection time (e.g., corresponding to signal profile 106B and the latency of the external network path 134).

In some embodiments, the timer 114 can determine a detection time difference between the first detection time and the second detection time. For example, the timer 114 can determine the detection time difference by counting a number of bits sampled between the first detection time and the second detection time.

In some embodiments, the processor 150 can determine the detection time difference between the first detection time and the second detection time. For example, the processor 150 can receive one or more detection time measurements from the timer 114, and subtract a detection time measurement corresponding to the second detection time with a detection time measurement corresponding to the first detection time.

The processor 150 can determine the latency of the network device 116 based at least partly on the detection time difference. As noted above, the signals of the signal profile 106A are typically received by the serializer 108 before the corresponding signals of the signal profile 106B because the arrival of the signals of signal profile 106B is typically delayed by the latency of the network device 116. Accordingly, the latency of the network device 116 can be determined based on a detection time difference of the change in the signal profiles 106A, 106B (e.g., pulse portions 202).

In some embodiments, the signal generator 104 can define a plurality of signal profiles 106 by transmission of corresponding signals (or lack thereof) along the internal network path 130 and the external network path 134 to the serializer 108. For example, the signal generator 104 can define a first signal profile 106 at a first time. Then at a second time subsequent to the first time, the signal generator 104 can define a second signal profile 106. The timer 114 can determine a plurality of detection time differences for the plurality of the signal profiles 106 and the processor 150 can determine the latency of the network device 116 based on an average of the detection time differences.

For each signal profile 106 in the plurality of signal profiles 106, a signal profile 106A is defined by transmission of a corresponding signal (or lack thereof) along the internal network path 130 and a signal profile 106B is defined by transmission of a corresponding signal (or lack thereof) along the external network path 134. It should be appreciated that the signal profile 106A is the same signal profile as the signal profile 106B. For example, each of the signal profile 106A and the signal profile 106B can include a pulse portion 202 and a non-pulse portion 204. Each pulse portion 202 includes a change in value relative to the respective non-pulse portion 204.

The serial input sampler 112 can sample each signal profile 106 in the plurality of signal profiles 106. That is, the serial input sampler 112 can sample each signal (or lack thereof) received via the internal network path 130 corresponding to each signal profile 106A and the pulse detector 128 can detect the change in the signal profile 106A (e.g., the change in the value of the pulse portion 202 relative to the respective non-pulse portion 204) at a first detection time. The serial input sampler 112 can also sample the signal (or lack thereof) received via the external network path 134 corresponding to each signal profile 106B and the pulse detector 128 can detect the change in the signal profile 106B (e.g., the change in the value of the pulse portion 202 relative to the respective non-pulse portion 204) at a second detection time.

The timer 114 can time the change in each signal profile 106 (e.g., the change in value of the pulse portion 202 relative to the non-pulse portion 204) within the plurality of signal profiles 106 to determine at least one detection time measurement for each signal profile 106. For example, each detection time measurement can include the first detection time and the respective second detection time for each signal profile 106. In some embodiments, the timer 114 can determine a detection time difference between the first detection time and the second detection time for each signal profile 106. In some embodiments, the detection time differences may be determined by the processor 150.

The processor 150 can determine an average detection time difference between the first detection times and the corresponding second detection times. For example, the processor 150 can determine an average detection time difference by summing each detection time difference and dividing by the number of signal profiles 106.

The processor 150 can determine the latency in the network device 116 based at least on the average detection time difference. Using an average detection time difference may result in a more accurate latency calculation, due to the averaging removing noise, jitter and/or other inconsistencies from individual detection time measurements.

In some embodiments, the processor 150 can modify and/or adjust the determined latency of the network device 116. For example, the processor 150 may subtract other latencies experienced by signals of the signal profile 106A and/or the signal profile 106B that were not caused by the network device 116. For instance, the processor 150 can determine the latency of one or more components of the FPGA circuit 102 and/or connections between two or more components of the FPGA circuit 102. Various latencies may also be stored in the memory 152. In some cases, one latency stored in the memory 152 can be used to adjust multiple determined latencies. For example, a latency related to the physical path length of a network path may be used to adjust the determined latencies of different network devices 116.

The processor 150 can determine the latency of one or more components and/or connections of the FPGA circuit 102 in various ways. In some embodiments, the determination can involve transmitting a signal through a component or a connection. The processor 150 can determine the latency of the component or connection based on the signal. For example, the processor 150 can determine the time taken for the signal to travel through the component or connection. For instance, the processor 150 may measure the time elapsed between the signal being input to the component or connection and the signal being output by the component or connection. Various inputs may be supplied to the processor 150 to determine the latency of the component or connection.

As shown in FIG. 4, the external network path 134 can include a plurality of links that include the network device 116. The external network path 134 can also include one or more other links that are not included in the internal network path 130. In some embodiments, the processor 150 can determine a latency of the at least one other link. The latency of the at least one other link may be stored in the memory 152. The processor 150 can determine the latency of the network device 116 based at least partly on the latency of the at least one other link.

In some embodiments, the FPGA circuit 102 can be configured to include one or more internal loopbacks. The internal loopbacks can connect two or more components of the FPGA circuit 102. The internal loop back connections may be used to determine the latency of particular components or particular network paths.

In some embodiments, the FPGA circuit 102 can include one or more other components (not shown) for modifying a signal format of the signals generated by the signal generator 104. For example, in some cases, the network device 116 may require a signal of the signal profile 106B to have a particular signal format. In some cases, one or more components of the FPGA circuit 102 may require a signal of the signal profile 106A or the signal profile 1066 to have a particular signal format.

For example, the processor 150 can determine that a signal of a signal profile 106B generated by the signal generator 104 has a first signal format different than a second signal format required by the network device 116. One or more components (not shown) of the FPGA circuit 102 can convert the signal so that the signal has the second signal format when the signal traverses the network device 116. The same or different one or more components of the FPGA circuit 102 can convert the signal received from the network device 116 so that the signal has the first signal format when the signal traverses a portion of the external network path 134 between the network device 116 and the serializer 108.

The first signal standard and the second signal standard can include different frequencies. For example, the first signal standard can include a first signal frequency, corresponding to the clock speed of the slower portion of the FPGA circuit 102 (e.g., operating at a clock speed lower than the clock multiplier 110). The second frequency standard can include a second signal frequency within a frequency that is required by the network device 116 that is greater than the first signal frequency. For instance, the second signal standard can be Ethernet.

Figure 5:
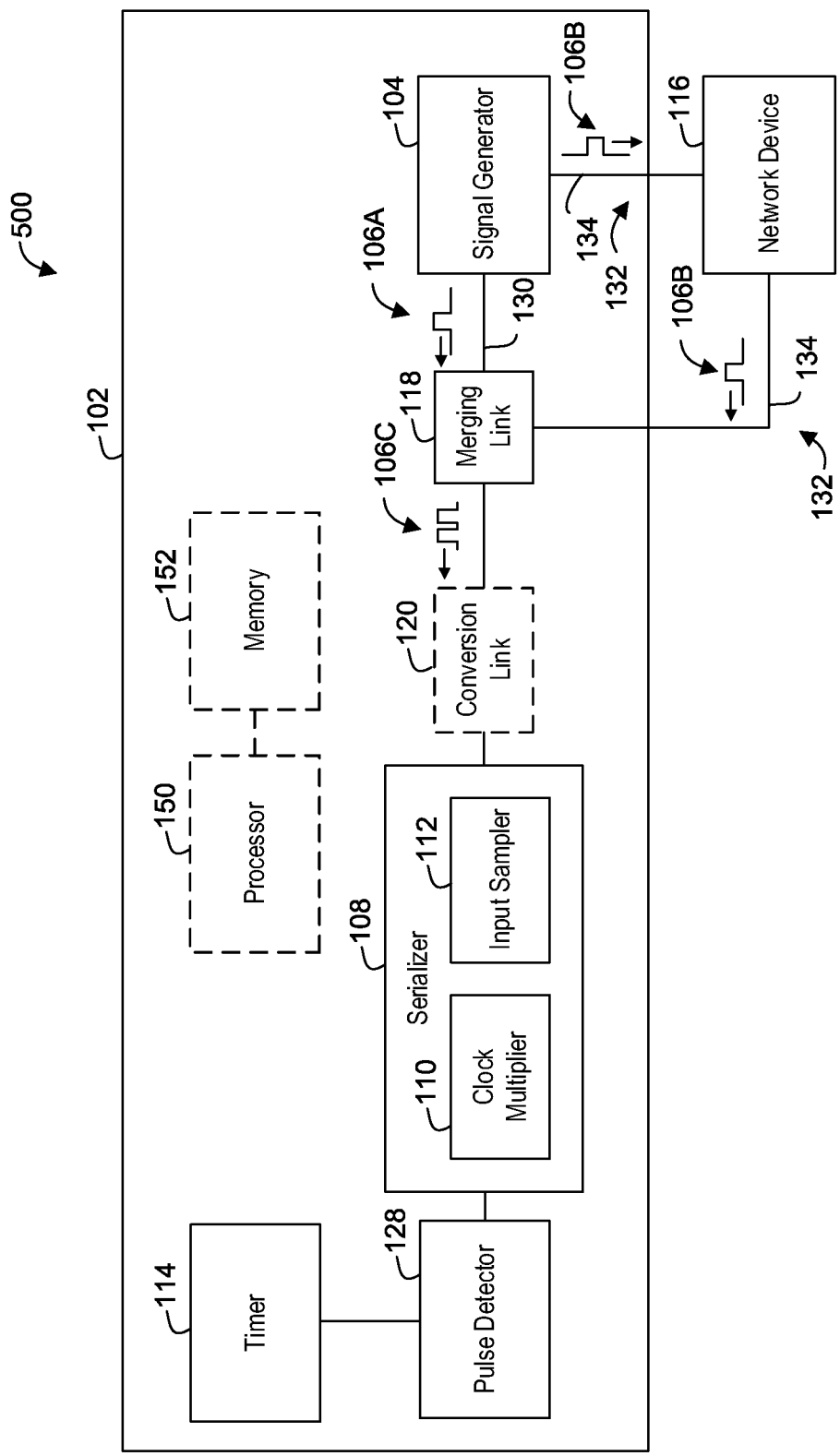
FIG. 5 is a block diagram of another example of the signal-timing FPGA circuit shown in FIG. 1, in accordance with an embodiment.

Referring now to FIG. 5, there is provided a diagram 500 of another example of the FPGA circuit 102. Although a FPGA circuit is shown, non-FPGA circuits providing all of the necessary functions may alternatively be used. The FPGA circuit 102 shown in FIG. 5 is similar to the FPGA circuit 102 shown in FIG. 4, except that the FPGA circuit 102 further includes a merging link 118 and, in some embodiments, a conversion link 120.

The merging link 118 can merge the internal network path 130 and the external network path 134. The merging link 118 can combine any signals transmitted on the network paths. Accordingly, the signal profile 106A defined by signals (or lack thereof) transmitted through the internal network path 130 can merge at the merging link 118 with the signal profile 1066 defined by signals (or lack thereof) transmitted through the external network path 134 to create a merged signal profile 106C. The merged signal profile 106C can include the change in both signal profiles 106A and 106B corresponding to the change in the operational mode of the signal generator 104. For example, the merged signal profile 106C can include two pulse portions 202. Each pulse portion 202 includes the change in value of the pulse portion 202 relative to the non-pulse portion 204 of the merged signal profile 106C.

In some embodiments, the merging link 118 can be an OR gate. The OR gate can merge the signal profile 106A of the internal network path 130 and the signal profile 1066 of the external network path 134 to provide the merged signal profile 106C.

The merged signal profile 106C defined by the merging link 118 can be sampled by the serializer 108. The serial input sampler 112 can sample the merged signal profile 106C and the pulse detector 128 can detect the change in the merged signal profile 106C (e.g., the change in the value of a pulse portion 202 relative to a non-pulse portion 204) at the first detection time, and then at the second detection time. For example, the serial input sampler 112 can generate a plurality of bits 208 in response to sampling the merged signal profile 106C, and the pulse detector 128 can detect both changes in value within the plurality of bits 208.

As shown in FIG. 5, the FPGA circuit 102 can also optionally include a conversion link 120 between the merging link 118 and the serializer 108. The conversion link 120 can convert signals between different signal formats. For example, the conversion link 120 can include a plurality of circuit components, including one or more capacitors and one or more resistors. The conversion link 120 may also include one or more biasing components for modifying a voltage level of a signal.

In some cases, the signals of the signal profiles 106A, 106B generated by the signal generator 104 and/or the merged signal profile 106C merged at the merging link 118 can have a first signal format, while the serializer 108 may require a second, different signal format. The conversion link 120 can convert the signals of the merged signal profile 106C from the first signal format to the second signal format so that the serializer 108 receives the signals in the second signal format. For example, the first signal format can include a low voltage differential signaling (LVDS) format and the second format can include a current mode logic (CML) format.

Figure 6:
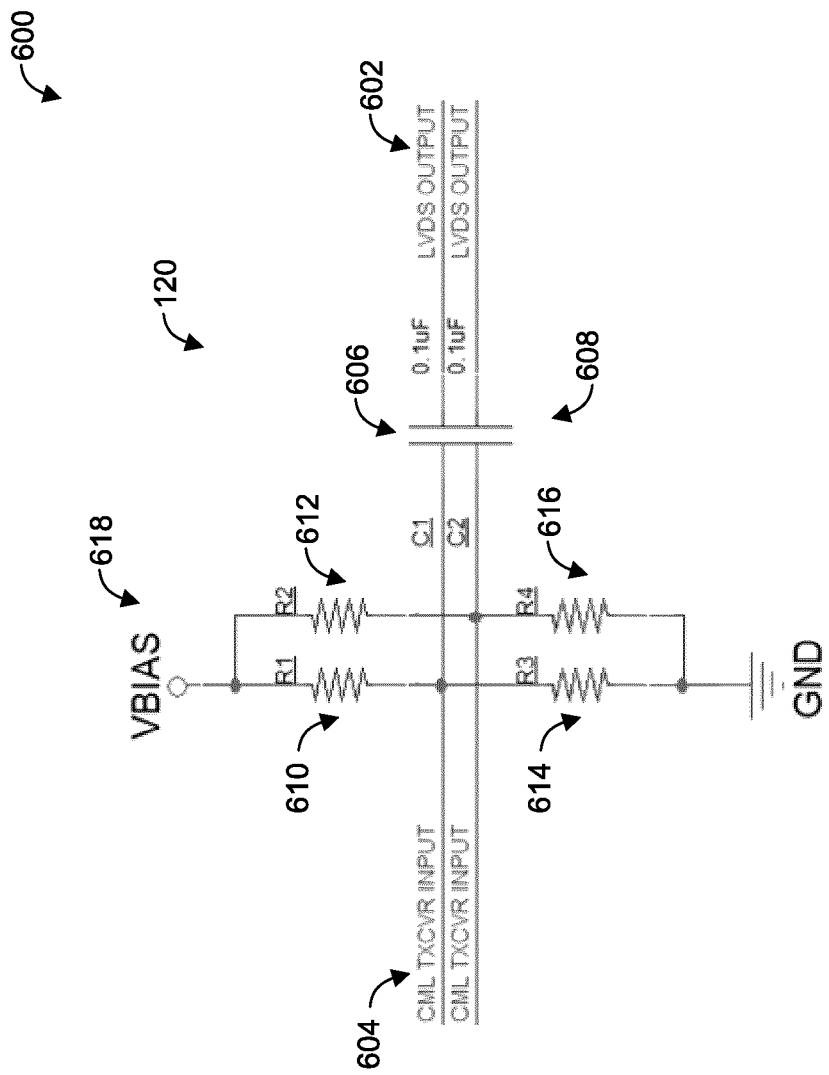
FIG. 6 is a circuit diagram of an example conversion link of the signal-timing FPGA circuit shown in FIG. 5, in accordance with an embodiment.

Referring now to FIG. 6, shown therein is a circuit diagram 600 of an example conversion link 120. As shown in FIG. 6, the conversion link 120 includes resistors 610, 612, 614, 616, capacitors 606, 608, and a bias voltage source 618. In operation, the conversion link 120 can convert a signal from a LVDS format at 602 to a CML format at 604. The conversion link 120 can modify a voltage level of a signal to convert the signal between signal formats.

Figure 7:
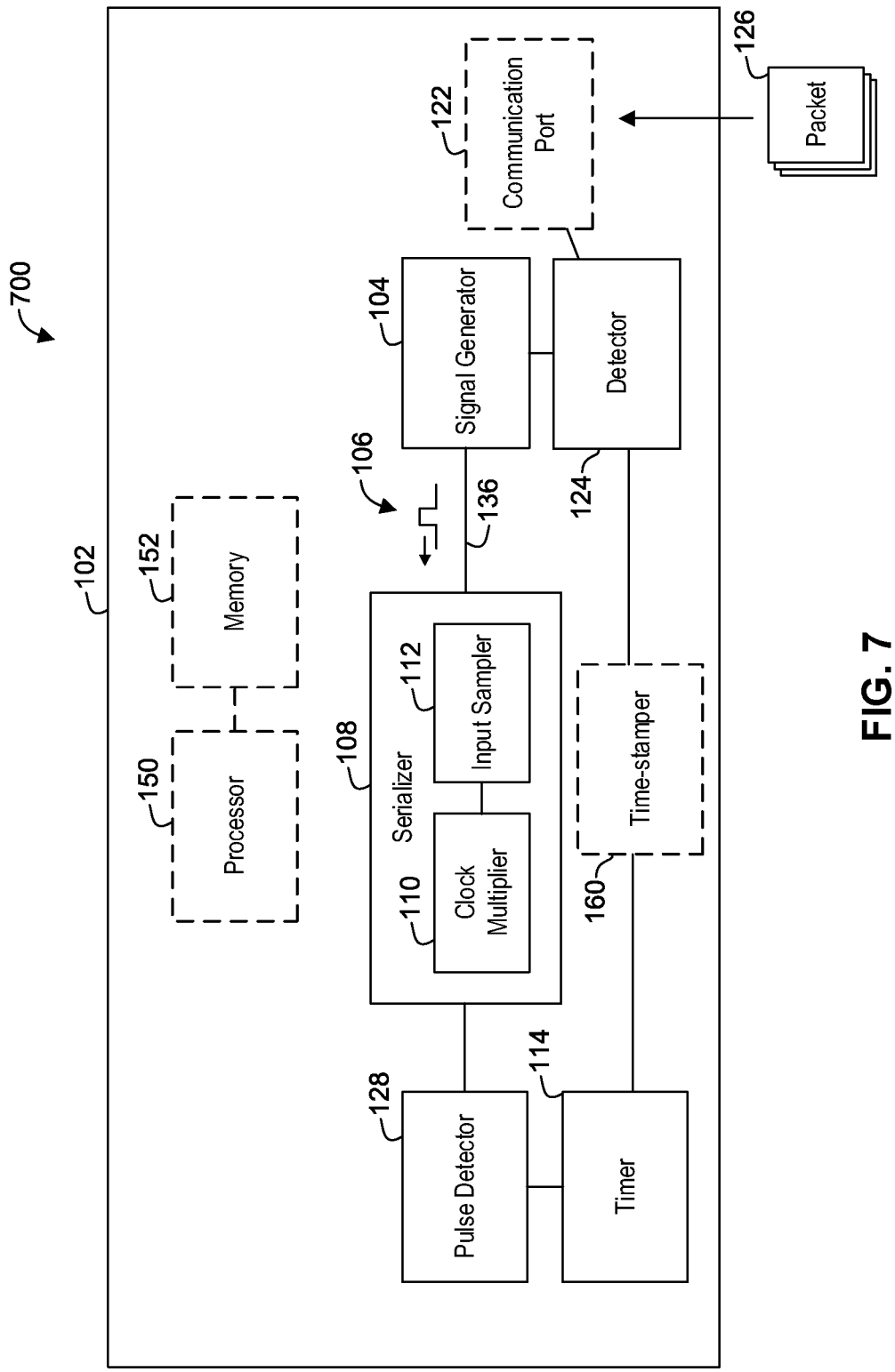
FIG. 7 is a block diagram of another example of the signal-timing FPGA circuit shown in FIG. 1, in accordance with an embodiment.

Referring now to FIG. 7, shown therein is a block diagram 700 of another example FPGA circuit 102. Although a FPGA circuit is shown, non-FPGA circuits providing all of the necessary functions may alternatively be used. The FPGA circuit 102 shown in FIG. 7 is similar to the FPGA circuit 102 shown in FIG. 1, except that the FPGA circuit 102 further includes a detector 124 and optionally, a communication port 122 and a time-stamper 160. The FPGA circuit 102 shown in FIG. 7 can be used to generate timestamps in response to data events. The FPGA circuit 102 can timestamp a data event by recording data, in association with the data event, which identifies when the data event occurred. The data event can be any event related to any data received, processed, stored, or transmitted by the FPGA circuit 102.

The detector 124 can detect the occurrence of the data event. In response to detecting the data event, the detector 124 can instruct the signal generator 104 to change from operating in a first mode of operation to a second mode of operation. For example, the signal generator 104 can first define the non-pulse portion 204 of the signal profile 106. In response to the detector 124 detecting the data event, the signal generator 104 can then define the pulse portion 202 of the signal profile 106.

The detector 124 can include a data reader (not shown). The data reader can be configured to read data packets 126. The data packets 126 can be any formatted package of data. The data packets 126 can include a data payload that is preceded by a preamble (not shown). For example, the data packets 126 can be an Ethernet packet. The data packets 126 can include an Ethernet preamble, and an Ethernet frame after the Ethernet preamble.

The detector 124 may detect a data event by detecting a data packet 126. The detector 124 may detect the data packet 126 by detecting one or more aspects of the data packet 126. For example, the detector 124 may detect a data event by detecting the preamble (or a portion thereof) of a data packet 126. As another example, the detector 124 may detect a data event by detecting the payload (or a portion thereof) of a data packet 126. For instance, the detector 124 may detect the first byte of the payload, the last byte of the payload, or a particular field within the payload (e.g., an IP address). In some embodiments, the detector 124 may detect a data event by detecting a particular pattern within the payload. In some embodiments, the detector 124 can detect a data event by detecting the arrival of a data packet 126 (e.g., via communication port 122).

As described above, the serial input sampler 112 can sample the signal profile 106 and the pulse detector 128 can detect the change in the signal profile 106 (e.g., the change in the value of pulse portion 202 relative to the non-pulse portion 204). The timer 114 can time the change in the signal profile 106 to determine one or more detection time measurements.

The processor 150 can timestamp the data event based on the at least one detection time measurement. For example, the processor 150 can record, in association with the data event, a timestamp based on the at least one detection time measurement. The timestamp may identify a time corresponding to the detection time measurement. In some embodiments, the processor 150 can record the timestamp in the memory 152. In some embodiments, the processor 150 can modify a data packet 126 to include the timestamp. In some embodiments, the detector 124 can timestamp the data event. In some embodiments, optionally, a time-stamper 160 can timestamp the data event. In some embodiments, the time-stamper 160 can be a component of the detector 124.

In some embodiments, the processor 150 may modify or adjust the timestamp to compensate for the latencies of one or more components of the FPGA circuit 102. The processor 150 can determine the latencies of the one or more components. The latencies may be stored in the memory 152.

The processor 150 can determine the latency of one or more components and/or connections of the FPGA circuit 102 in various ways. In some embodiments, the determination can involve transmitting a signal through a component or a connection. The processor 150 can determine the latency of the component or connection based on the signal. For example, the processor 150 can determine the time taken for the signal to travel through the component or connection. For instance, the processor 150 may measure the time elapsed between the signal being input to the component or connection and the signal being output by the component or connection. Various inputs may be supplied to the processor 150 to determine the latency of the component or connection.

For example, the processor 150 can determine the latency of a network path 136, along which signals of a signal profile are transmitted from the signal generator 104 to the serializer 108. The latency of the network path 136 may be stored in the memory 152. The processor 150 can determine the timestamp based at least partly on the latency of the network path 136.

In another example, the processor 150 can determine the latency of the detector 124 detecting the data event and instructing the signal generator 104 to change from operating in the first mode of operation to the second mode of operation. The latency of the data reader 124 may be stored in the memory 152. The processor 150 can determine the timestamp based at least partly on detector latency.

Optionally, a communication port 122 can be coupled to the detector 124. The communication port 122 can receive data packets 126. For example, the communication port 122 can be connected to a network (not shown) and the packet 126 can be transmitted from the network to the communication port 122. The communication port 122 can be coupled to the detector 124 so that the packets 126 received by the communication port 122 can be read by the detector 124.

Although not shown in FIG. 7 for ease of illustration, a conversion link can be coupled between the signal generator 104 and the serializer 108. As described above, the conversion link can convert the format of the signals generated by the signal generator 104 so that the signals can be received by the serializer 108.

In some embodiments, the detector 124 can detect each data event in a plurality of data events. The detector 124 can instruct the signal generator 104 to define a plurality of pulse portions 202 of the signal profile 106. The plurality of pulse portions 202 can include an associated pulse portion 202 for each data event.

The pulse detector 128 can detect a plurality of changes in value of the plurality of pulse portions 202 relative to a plurality of non-pulse portions 204.

The timer 114 can provide a plurality of at least one detection time measurements. The plurality of at least one detection time measurements can include an associated at least one detection time measurement for each data event.

The processor 150 can determine the timestamp for each data event based on the associated at least one detection time measurement for that data event. In some embodiments, the processor 150 can determine the timestamp for each data event based on the latency of the network path 136 and the latency of the detector 124. For example, the processor 150 can retrieve the latency of the network path 136 and the latency of the detector 124 from the memory 152.

Figure 8:
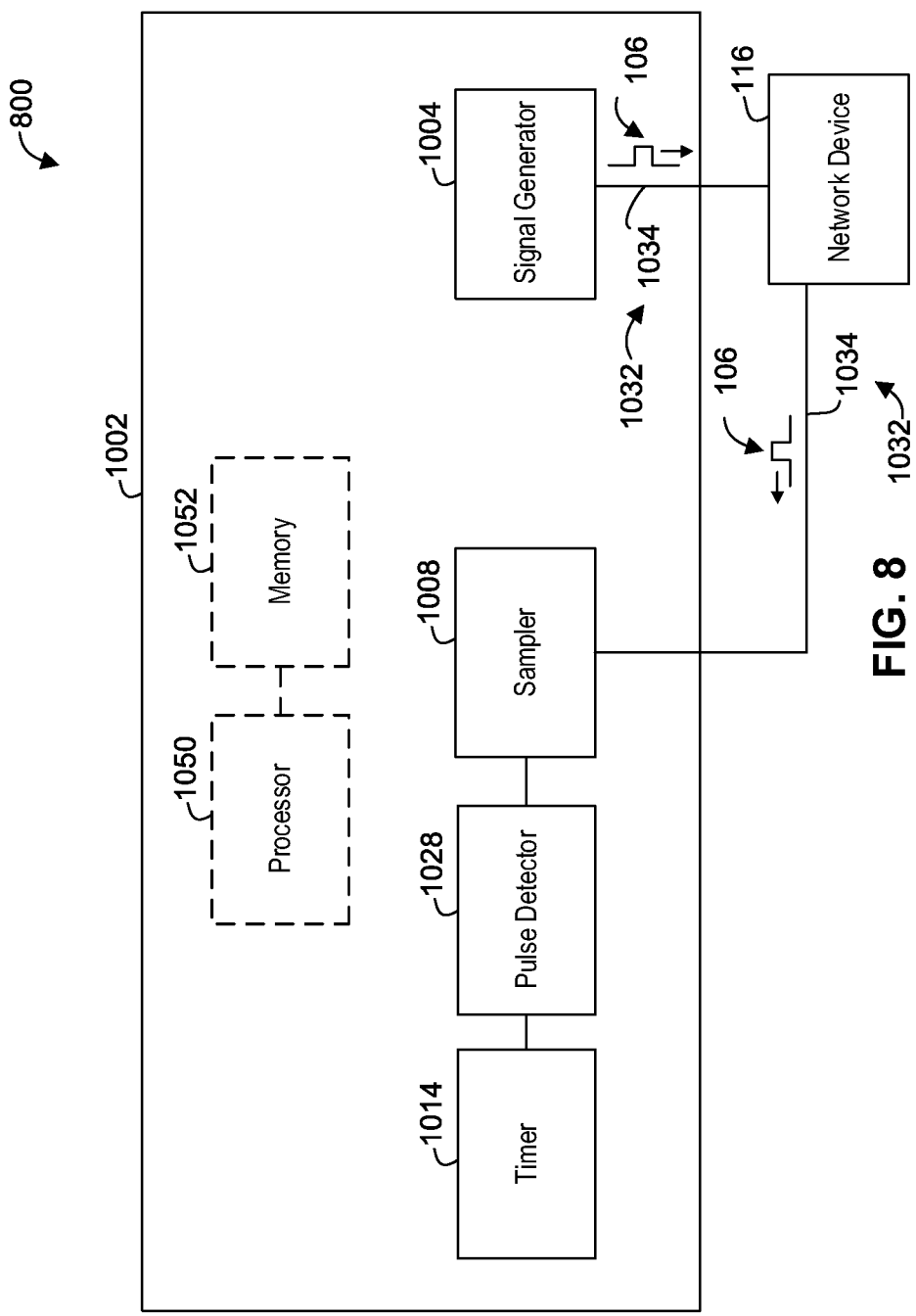
FIG. 8 is a block diagram of an example latency measurement system, in accordance with an embodiment.

Referring now to FIG. 8, there is provided a block diagram 800 of an example system 1002 for measuring latency of a network device 116. As noted above, the network device 116 can be any device that can be used in a computer network. The latency measurement system 1002 includes a signal generator 1004, a sampler 1008, pulse-detector 1028, a timer 1014, and a signal-transmitting connector 1032.

In some embodiments, the latency measurement system 1002 can be implemented at least in part using the FPGA circuit 102 disclosed herein. For example, the signal generator 1004 can be implemented using the signal generator 104, the sampler 1008 can be implemented using the serializer 108, the pulse detector 1028 can be implemented using the pulse detector 128, and the timer 1014 can be implemented using the timer 114. However, it should be appreciated that the system 1002 may, in some embodiments, be implemented entirely without a FPGA circuit and/or any components thereof.

The signal generator 1004 can generate any electronic signal. The signal generator 1004 can define a signal profile. The signal generator 1004 can define the signal profile by generating a signal or by not generating a signal (i.e., a notional signal having a constant, zero magnitude). The signal generator 1004 can define a different signal profiles depending on its mode of operation (e.g., by providing signals or the absence of signals). In some embodiments, during at least one of a first mode of operation and a second mode of operation, the signal generator 1004 defines the signal profile 106 by generating a signal. For example, the signal generator 1004 can generate the signal profile 106 described herein. The signal profile 106 can include the pulse portion 202 and the non-pulse portion 204. The pulse portion 202 differs in value from the non-pulse portion 204 of the signal profile 106.

A signal-transmitting connector 1032 can electronically link the signal generator 1004 and the sampler 1008 to provide an external network path 1034 for signals to travel from the signal generator 1004 to the sampler 1008 via the network device 116. In some cases, the external network path 1034 may be described with reference to a start point and an end point (i.e., with the network device 116 in between the start point and the end point). As shown in FIG. 8, the start point can be the signal generator 1004 and the end point can be the sampler 1008. The end point may be sampled to sample the signal profile 106.

Optionally, a conversion link (not shown) can be coupled between the signal generator 1004 and the sampler 1008. The conversion link can convert the format of the signals generated by the signal generator 1004 so that the signals can be received by the sampler 1008.

The sampler 1008 can sample the signal profile 106 defined by the signal generator 1004. The sampler 1008 can sample the signal profile 106 at a frequency of at least 4 gigahertz, or, in some embodiments, of at least 15 gigahertz. The sampler 1008 can sample the signal profile 106 to generate a plurality of bits 208. Each bit in the plurality of bits 208 corresponds to a value of the signal profile 106 during the sampling.

The pulse detector 1028 can detect the change in the signal profile 106 corresponding to the change in the operational mode of the signal generator 1004 (e.g., the change in the value of the pulse portion 202 relative to the non-pulse portion 204) by detecting a change in the plurality of bits 208.

The timer 1014 is in communication with the pulse detector 1028. The timer 1014 can time the change in the signal profile 106 corresponding to the change in the operational mode of the signal generator 1004 (e.g., the change in the value of the pulse portion 202 relative to the non-pulse portion 204) to provide at least one detection time measurement.

In some embodiments, the system 1002 can include a processor 1050 and a memory 1052. The processor 1050 can receive data from the various other components of the system 1002 and perform various processing on the received data. The memory 1052 can also receive data from the various other components of the system 1002 and store the received data.

The processor 1050 can determine the latency of the network device 116 based at least partly on the at least one detection time measurement. In some embodiments, the processor 1050 may also determine the detection time measurements.

Figure 9:
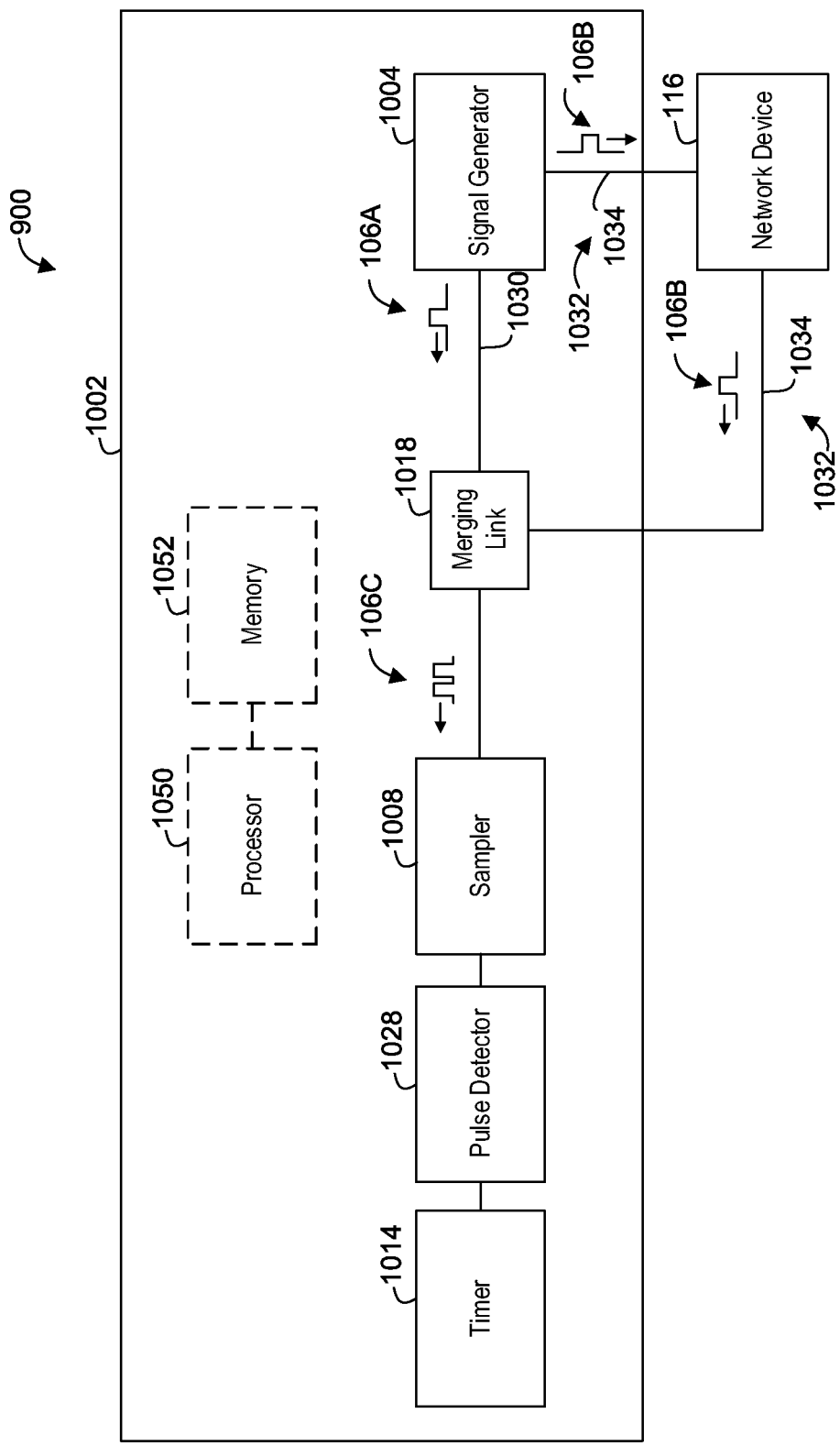
FIG. 9 is a block diagram of another example of the latency measurement system shown in FIG. 8, in accordance with an embodiment.

Referring now to FIG. 9, shown therein is a block diagram 900 of another example system 1002 for measuring latency of a network device 116. The latency measurement system 1002 shown in FIG. 9 is similar to the latency measurement system 1002 shown in FIG. 8, except that the latency measurement system 1002 further includes an internal network path 1030 and a merging link 1018.

The internal network path 1030 can provide a path for a signal from the signal generator 1004 to the sampler 1008 without traversing the network device 1016. The internal network path 1030 can have the same start point and end point as the external network path 1034.

As shown in FIG. 9, the version of the signal profile 106 that is defined by the signal generator 104 transmitting a signal (or lack thereof) along the internal network path 1030 is indicated by signal profile 106A. The version of the signal profile 106 defined by the signal generator 1004 transmitting a signal (or lack thereof) along the external network path 1034 is indicated by the signal profile 1066. It should be appreciated that the signal profile 106A is the same as the signal profile 1066. For example, each of the signal profile 106A and the signal profile 106B can include the pulse portion 202 and the non-pulse portion 204.

The merging link 1018 merges the internal network path 1030 and the external network path 1034. In operation, the signal profile 106A corresponding to signals (or lack thereof) transmitted through the internal network path 1030 merges at the merging link 1018 with the signal profile 106B corresponding to signals (or lack thereof) transmitted through the external network path 1034 to create a merged signal profile 106C. For example, the merged signal profile 106C can include two pulse portions 202. Each of the pulse portions 202 can include the change in value of the pulse portion 202 relative to the non-pulse portion 204 of the merged signal profile 106C. For example, the merging link 1018 can be an OR gate for merging the signal profile 106A of the internal network path 1030 and the signal profile 106B of the external network path 1034 to provide the merged signal profile 106C.

Optionally, a conversion link (not shown) can be coupled between the merging link 1008 and the sampler 1008. As described above, the conversion link can convert the format of the signals generated by the signal generator 1004 so that the signals can be received by the sampler 1008.

The sampler 1008 can sample the merged signal profile 106C at an end point of the external network path 1034 and the internal network path 1030 and the pulse detector 1028 detect a change in the merged signal profile 106C (e.g., the change in the value of a pulse portion 202 relative to a non-pulse portion 204) at a first detection time and at a second detection time subsequent to the first detection time. As noted above, the signal profile 106A is typically received first by the sampler 1008 because the signal profile 106B is delayed by the latency of the network device 116.

The timer 1014 can determine a detection time difference between the first detection time and the second detection time. The at least one detection time measurement can include the first detection time, the second detection time, and the detection time difference. In some embodiments, the timer 1014 can determine the detection time difference by counting a number of bits sampled between the first detection time and the second detection time. In some embodiments, the processor 1050 may determine the detection time difference.

In some embodiments, the signal generator 1004 can define a plurality of signal profiles 106 by transmitting signals (or lack thereof) through the internal network path 1030 and the external network path 1034 to the end point or the sampler 1008. For example, the signal generator 1004 can define a first signal profile 106 at a first time. Then at a second time subsequent to the first time, the signal generator 104 can define a second signal profile 106. The timer 1014 can determine a plurality of detection time differences for the plurality the signal profiles 106 and the processor 1050 can determine the latency of the network device 116 based on an average of the detection time differences.

For each signal profile 106 in the plurality of signal profiles 106, a signal profile 106A is defined by transmission of a corresponding signal (or lack thereof) along the internal network path 130 and a signal profile 106B is defined by the transmission of a corresponding signal (or lack thereof) along the external network path 134. It should be appreciated that the signal profile 106A is the same signal profile as the signal profile 106B. For example, each of the signal profiles 106A and the signal profiles 106B can include a pulse portion 202 and a non-pulse portion 204. Each pulse portion 202 includes a change in value relative to the respective non-pulse portion 204.

The sampler 1008 can sample each signal profile 106 in the plurality of signal profiles 106. The sampler 1008 can sample each signal (or lack thereof) received via the internal network path 1030 corresponding to each signal profile 106A and the pulse detector 1028 can detect the change in the signal profile 106A (e.g., the change in value of the pulse portion 202 relative to the respective non-pulse portion 204) at a first detection time. The sampler 1008 can also sample each signal (or lack thereof) received via the external network path 1034 corresponding to each signal profile 106B and the pulse detector 1028 can detect the change in the signal profile 106B (e.g., the change in the value of the pulse portion 202 relative to the respective non-pulse portion 204) at a second detection time.

The timer 1014 can time the change in each signal profile 106 (e.g., the change in value of the pulse portion 202 relative to the non-pulse portion 204) within the plurality of signal profiles 106 to determine at least one detection time measurement for each signal profile 106. For example, each detection time measurement can include the respective first detection time and the respective second detection time. In some embodiments, the timer 1014 can determine a detection time difference between a respective first detection time and a respective second detection time for each signal profile 106. In some embodiments, the processor 1050 can determine the detection time differences.

The processor 1050 can determine an average detection time difference between the first detection time and the second detection time. For example, the processor 1050 can receive a detection time difference for each signal profile 106 from the timer 1014. The processor 1050 can determine an average detection time difference by summing each detection time difference and dividing the sum by the number of signal profiles 106.

The processor 1050 can determine the latency in the network device 116 based at least on the average detection time difference. As noted above, using an average detection time difference may result in a more accurate latency calculation, due to the averaging removing noise, jitter, and/or other inconsistencies from individual detection time measurements.

In some embodiments, the processor 1050 can modify and/or adjust the determined latency of the network device 116. For example, the processor 1050 may subtract other latencies experienced by the signals of the signal profile 106A, the signal profile 1066, and/or the signal profile 106C that were not caused by the network device 116. For instance, the processor 1050 can determine the latency of one or more components of the system 1002 and/or connections between two or more components of the system 1002. The latencies may be stored in the memory 1052. In some cases, one latency stored in the memory 1052 can be used to adjust multiple determined latencies. For example, a latency related to the physical path length of a network path may be used to adjust the determined latencies of different network devices 116.

The processor 1050 can determine the latency of one or more components and/or connections of the latency measurement system 1002 in various ways. In some embodiments, the determination can involve transmitting a signal through a component or a connection. The processor 1050 can determine the latency of the component or connection based on the signal. For example, the processor 1050 can determine the time taken for the signal to travel through the component or connection. For instance, the processor 1050 may measure the time elapsed between the signal being input to the component or connection and the signal being output by the component or connection. Various inputs may be supplied to the processor 1050 to determine the latency of the component or connection.

For example, as shown in FIG. 9, the external path 1034 can include a plurality of links that include the network device 116. The external path 1034 can also include one or more other links that are not included in the internal network path 1030. In some embodiments, the processor 1050 can determine a latency of the at least one other link. The latency of the at least one other link may be stored at the memory 1052. The processor 1050 can determine the latency of the network device 116 based at least partly on the latency of the at least one other link.

In another example, the processor 1050 can determine a latency of the internal network path 1030. The latency of the internal network path 1030 may be stored at the memory 1052. The processor 1050 can determine the latency of the network device 116 based at least partly on the latency of the internal network path 1030.

In some embodiments, the latency measurement system 1002 can be configured to include one or more internal loopbacks. The internal loopbacks can connect two or more components of the latency measurement system 1002. The internal loop back connections may be used to determine the latency of particular components or particular network paths.

Figure 10:
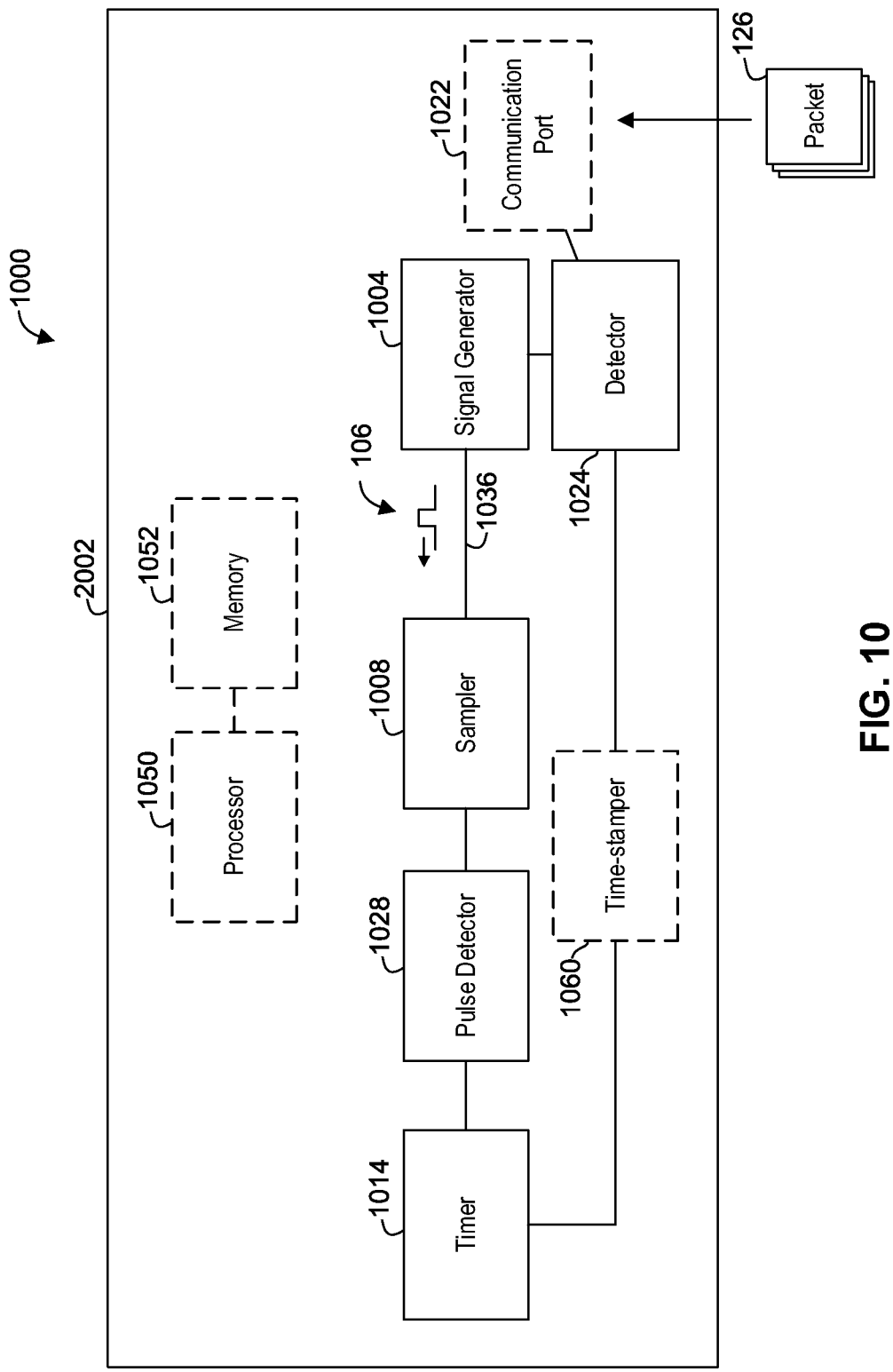
FIG. 10 is a block diagram of an example timestamping system, in accordance with an embodiment.

Referring now to FIG. 10, there is provided a block diagram 1000 of a system 2002 for timestamping a data event. The timestamping system 2002 can timestamp the data event by recording data, in association with the data event, which identifies when the data event occurred. The system 2002, as shown in FIG. 10, includes similar components as the latency measurement system 1002 shown in FIG. 8, except that the timestamping system 2002 further includes a detector 1024 and optionally a communication port 2022 and a time-stamper 1060, and may lack the external network path components for connecting to an external network device.

In some embodiments, the timestamping system 2002 can be implemented using the FPGA circuit 102 disclosed herein. For example, the signal generator 2004 can be implemented using the signal generator 104, the sampler 2008 can be implemented using the serializer 108, the pulse detector 1028 can be implemented using the pulse detector 128, and the timer 2014 can be implemented using the timer 114. However, it should be appreciated that the system 1002 may, in some embodiments, be implemented entirely without a FPGA circuit and/or any components thereof.

In operation, the signal generator 1004 can first operate in a first mode of operation to define a signal profile 106 (e.g., that includes the non-pulse portion 204 and not the pulse-portion 202).

The detector 1024 can detect a data event. In response to detecting the data event, the detector 1024 can instruct the signal generator 1004 to change from operating in the first mode of operation to a second mode of operation to change the signal profile 106. For example, the signal generator 1004 can change from defining the non-pulse portion 204 to defining the pulse portion 202. As noted above, the pulse portion 202 differs in value from the non-pulse portion 204 of the signal profile 106.

The detector 1024 can include a data reader (not shown). The data reader can be configured to read data packets 126. The data packets 126 can be any formatted package of data. The data packets 126 can include a data payload that is preceded by a preamble (not shown). For example, the data packets 126 can be an Ethernet packet. The data packets 126 can include an Ethernet preamble, and an Ethernet frame after the Ethernet preamble.

The detector 1024 may detect a data event by detecting a data packet 126. The detector 1024 may detect the data packet 126 by detecting various aspects of the data packet 126. For example, the detector 1024 may detect a data event by detecting the preamble (or a portion thereof) of a data packet 126 or the payload (or a portion thereof) of a data packet 126. In some embodiments, the detector 1024 can detect a data event by detecting the arrival of a data packet 126 (e.g., via communication port 1022).

The sampler 1008 can sample the signal profile 106. The sampler 1008 can sample the signal profile 106 at a frequency of at least 4 gigahertz, or in some embodiments, of at least 15 gigahertz. The sampler 1008 can sample the signal profile 106 to generate a plurality of bits 208. Each bit in the plurality of bits 208 can correspond to a value of the signal profile 106 during the sampling.

The pulse detector 1028 can detect the change in the signal profile 106 (e.g., the change in value of the pulse portion 202 relative to the non-pulse portion 204) by detecting a change in value in the plurality of bits 208.

The timer 1014 can time the change in value to provide at least one detection time measurement.

The time-stamper 1060 can timestamp the data event based on the at least one detection time measurement. For example, the time-stamper 1060 can record, in association with the data event, a timestamp based on the at least one detection time measurement. In some cases, the timestamp can be stored in the memory 1052. In other cases, the timestamp may be appended to a data packet 126. In some embodiments, the processor 1050 can timestamp the data event. In some embodiments, the detector 1024 can timestamp the data event. In some embodiments, the time-stamper can be a component of the detector 1024.

In some embodiments, the processor 1050 may modify or adjust the timestamp to compensate for the latencies of one or more components and/or connections between two or more components of the timestamping system 2002. The processor 150 can determine the latencies of the one or more components. The latencies may be stored in the memory 1052. In some cases, one latency stored in the memory 1052 can be used to adjust multiple determined latencies. For example, a latency related to the physical path length of a network path may be used to adjust the determined latencies of different network devices 116.

The processor 1050 can determine the latency of one or more components and/or connections of the timestamping system 2002 in various ways. In some embodiments, the determination can involve transmitting a signal through a component or a connection. The processor 1050 can determine the latency of the component or connection based on the signal. For example, the processor 1050 can determine the time of flight of the signal through the component or connection. For instance, the processor 1050 may compare the time at which the signal is input to the component or connection and the time at which the signal is output by the component or connection. Various inputs may be supplied to the processor 1050 to determine the latency of the component or connection.

For example, the processor 1050 can determine the latency of a network path 1036, along which the signals of the signal profile 106 are transmitted from the signal generator 1004 to the sampler 1008. The latency of the network path 1036 may be stored in the memory 1052. The processor 1050 can determine the timestamp based at least partly on the latency of the network path 1036.

In another example, the processor 1050 can determine the latency of the detector 1024 detecting the data event and instructing the signal generator 1004 to change operational modes. The latency of the detector 1024 may be stored in the memory 1052. The processor 1050 can determine the timestamp based at least partly on the detector latency.

Optionally, a conversion link (not shown) can be coupled between the signal generator 1004 and the sampler 1008. As described above, the conversion link can convert the format of the signals generated by the signal generator 1004 so that the signals can be received by the sampler 1008.

Optionally, a communication port 1022 can be coupled to the detector 1024. The communication port 1022 can receive data packets 1026. The communication port 1022 can be coupled to the detector 1024 so that the packets 126 received by the communication port 1022 can be read by the detector 1024.

In some embodiments, the detector 1024 can detect each data event in a plurality of data events. The detector 1024 can instruct the signal generator 1004 to define a plurality of pulse portions 202 of the signal profile 106. The plurality of pulse portions 202 can include an associated pulse portion 202 for each data event.

The pulse detector 1028 can detect a plurality of changes in value of the plurality of pulse portions 202 relative to a plurality of non-pulse portions 204.

The timer 1014 can provide a plurality of at least one detection time measurements. The plurality of at least one time measurements can include an associated at least one detection time measurement for each data event.

The processor 1050 can determine the timestamp for each data event based on the associated at least one detection time measurement for that data event. In some embodiments, the processor 1050 can determine the timestamp for each data event based on the latency of the network path 1036 and the latency of the detector 1024. For example, the processor 1050 can retrieve the latency of the network path 1036 and the latency of the detector 1024 from the memory 1052.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments. Furthermore, this description is not to be considered as limiting the scope of these embodiments in any way, but rather as merely describing the implementation of these various embodiments.

The invention claimed is:

1. A signal timing method, the method comprising:
providing a FPGA circuit comprising a serializer for converting data streams between serial transmission and parallel transmission and a signal generator for defining signal profiles, the serializer comprising a serial input sampler for sampling signals received at the serializer, and a clock multiplier for changing signal frequencies, wherein a clock speed of at least one portion of the FPGA circuit is lower than a clock speed of the clock multiplier;
reconfiguring the clock multiplier to provide the clock speed of the clock multiplier to the serial input sampler;
reconfiguring the serial input sampler to operate at the clock speed of the clock multiplier;
during a first mode of operation, operating the signal generator to define a signal profile;
instructing the signal generator to change from operating in the first mode of operation to operating in a second mode of operation, wherein the signal profile defined by the signal generator in the first mode of operation differs from the signal profile defined by the signal generator in the second mode of operation, and wherein the signal profile defined by the signal generator during at least one of the first mode of operation and the second mode of operation is defined by the signal generator transmitting a signal to the serializer;
operating the serial input sampler to operate at the clock speed of the clock multiplier to sample the signal profile;
detecting a change in the signal profile corresponding to the signal generator changing from operating in the first mode of operation to operating in the second mode of operation; and
timing the change in value to provide at least one detection time measurement.

2. The method as defined in claim 1 wherein the clock speed of the clock multiplier is greater than 4 gigahertz.

3. The method as defined in claim 1 wherein the clock speed of the clock multiplier is greater than 15 gigahertz.

4. The method as defined in claim 1, wherein
operating the serial input sampler to sample the signal profile comprises sampling the signal profile at the clock speed of the clock multiplier to generate a plurality of bits, each bit of the plurality of bits corresponding to a value of the signal profile during the sampling; and
detecting the change in the signal profile corresponding to the signal generator changing from operating in the first mode of operation to operating in the second mode of operation comprises detecting at least one change in value in the plurality of bits.

5. The method as defined in claim 1, wherein timing the change in value to provide the at least one detection time measurement comprises counting a number of bits sampled until the change in the signal profile corresponding to the signal generator changing from operating in the first mode of operation to operating in the second mode of operation is detected.

6. The method as defined in claim 1, further comprising connecting the FPGA circuit to a network device;
providing an internal network path from the signal generator to the serializer without traversing the network device;
providing an external network path from the signal generator to the serializer via the network device, wherein
operating the signal generator to define the signal profile comprises transmitting the signal through the internal network path and the external network path to the serializer,
operating the serial input sampler to sample the signal profile comprises sampling the signal profile corresponding to the signal i) received via the internal network path and then ii) received via the external network path, and
detecting the change in the signal profile corresponding to the signal generator changing from operating in the first mode of operation to operating in the second mode of operation comprises detecting the change in the signal profile corresponding to the signal i) received via the internal network path at a first detection time, and then ii) received via the external network path at a second detection time; and,
determining the latency in the network device based at least partly on a detection time difference between the first detection time and the second detection time;
wherein the at least one detection time measurement comprises the first detection time, the second detection time, and the detection time difference.

7. The method as defined in claim 6 wherein determining the detection time difference comprises counting a number of bits sampled between the first detection time and the second detection time.

8. The method as defined in claim 6 wherein
the external network path comprises a plurality of links, including the network device and at least one other link, not included in the internal network path;
the method further comprises determining a latency of the at least one other link; and
the latency in the network device is determined based on the latency of the at least one other link and the detection time difference.

9. The method as defined in claim 6 wherein
the internal network path and the external network path merge at a merging link;
the signal transmitted through the internal network path merges at the merging link with that signal transmitted through the external network path to create a merged signal, the merged signal defining a merged signal profile comprising two changes in the signal profile, each change in the signal profile corresponding to the signal generator changing from operating in the first mode of operation to operating in the second mode of operation;

the merged signal is transmitted to the serial input sampler;

operating the serial input sampler to sample the signal profile comprises operating the serial input sampler to sample the merged signal profile; and detecting the change in the signal profile comprises detecting the change in the signal profile at the first detection time and then at the second detection time.

10. The method as defined in claim 9 wherein the merging link is an OR gate for merging the signal of the internal network path and the signal of the external network path to provide the merged signal.

11. The method as defined in claim 9, wherein
the internal network path and the external network path share a conversion link for transmitting the signal between the merging link and the serializer;
the signal generated by the signal generator has a first signal format;
the merged signal at the merging link has the first signal format;
the conversion link comprises a plurality of circuit components, including at least one capacitor and at least one resistor, for converting the signal from the first signal format to a second signal format such that the serializer receives the signal in the second signal format.

12. The method as defined in claim 11, wherein
the plurality of circuit components further comprises at least one biasing component; and
converting the signal from the first signal format to the second signal format comprises modifying a voltage level of the signal.

13. The method as defined in claim 11, wherein
the first signal format comprises a low voltage differential signaling format; and
the second signal format comprises a current mode logic format.

14. The method as defined in claim 6, further comprising determining that the signal generated by the signal generator has a first signal format different than a second signal format required by the network device;
converting the signal from the first signal format to the second signal format so that the signal has the second signal format when the signal traverses the network device; and
converting the signal received from the network device from the second signal format back to the first signal format so that the signal has the first signal format when the signal traverses a portion of the external network path between the network device and the serializer.

15. The method as defined in claim 14, wherein
the first signal standard comprises a first signal frequency, wherein the first signal frequency corresponds to the clock speed of the at least one portion of the FPGA circuit; and
the second signal standard comprises a second signal frequency within a frequency range required by the network device, wherein the second signal frequency is greater than the first signal frequency.

16. The method as defined in claim 14, wherein the second signal standard is Ethernet.

17. The method as defined in claim 6, wherein
defining the signal profile comprises defining a plurality of signal profiles by operating the signal generator to transmit a plurality of signals through the internal network path and the external network path to the serializer, each signal in the plurality of signals having a corresponding signal profile in the plurality of signal profiles, each signal profile in the plurality of signal profiles comprising a change in the signal profile corresponding to the signal generator changing from operating in the first mode of operation to operating in the second mode of operation;
operating the serial input sampler to sample the signal profile comprises operating the serial input sampler to sample each signal in the plurality of signals i) received via the internal network path, and then ii) received via the external network path;
detecting the change in the signal profile corresponding to the signal generator changing from operating in the first mode of operation to operating in the second mode of operation comprises detecting, for each signal profile in the plurality of signal profiles, the change in the signal profile corresponding to i) the signal received via the internal network path at a first detection time, and then ii) the signal received via the external network path at a second detection time;
the method further comprises determining, for the plurality of signal profiles, an average detection time difference between the first detection time and the second detection time; and
determining the latency in the network device comprises determining the latency in the network device based at least partly on the average detection time difference.

18. The method as defined in claim 1, further comprising operating a detector to detect data event;
upon the detector detecting the data event, instructing the signal generator of the FPGA circuit to change from operating in the first mode of operation to operating in a second mode of operation; and
recording in association with the data event a timestamp based on the at least one detection time measurement.

19. The method as defined in claim 18 wherein
the signal is transmitted from the signal generator to the serializer along a network path;
the method further comprises determining a latency of the network path; and
the timestamp is determined based at least partly on the latency of the network path.

20. The method as defined in claim 19 wherein
the method further comprises determining a latency of the detector detecting the data event and the instructing the signal generator of the FPGA circuit to change from operating in the first mode of operation to operating in the second mode of operation; and
the timestamp is determined further based at least partly on the latency of the detector detecting the data event and then instructing the signal generator of the FPGA circuit to change from operating in the first mode of operation to operating in the second mode of operation.

21. The method as defined in claim 18 further comprising receiving a data packet comprising a payload preceded by a preamble, wherein the detector comprises a data reader, and operating the detector to detect the data event comprises operating the data reader to detect at least a portion of the payload of the data packet.

22. A signal-timing FPGA circuit comprising:
a serializer for converting data streams between serial transmission and parallel transmission, the serializer comprising a serial input sampler for sampling signals received at the serializer, and a clock multiplier for changing signal frequencies;
a pulse detector for detecting a change in value in the sampled signals;

at least one slower portion having a slower clock speed, the slower clock speed being slower than a clock speed of the clock multiplier;

a timer in communication with the serializer; and a signal generator for defining a signal profile, the signal generator having a first mode of operation and a second mode of operation, wherein the signal profile defined by the signal generator in the first mode of operation differs from the signal profile defined by the signal generator in the second mode of operation, and wherein the signal generator defines the signal profile during at least one of the first mode of operation and the second mode of operation by transmitting a signal to the serializer via the at least one slower portion; wherein, in operation, the clock multiplier provides the clock speed of the clock multiplier to the serial input sampler;

the serial input sampler operates at the clock speed of the clock multiplier to sample the signal profile at the serializer;

the pulse detector detects a change in the signal profile corresponding to the signal generator changing from operating in the first mode of operation to operating in the second mode of operation; and based on the pulse detector detecting the change in the signal profile, the timer determines at least one detection time measurement.

* * * * *